United States Patent
Oda et al.

(10) Patent No.: US 7,292,277 B2
(45) Date of Patent: Nov. 6, 2007

(54) SOLID-STATE IMAGE PICK-UP DEVICE AND DIGITAL STILL CAMERA

(75) Inventors: Kazuya Oda, Asaka (JP); Masafumi Inuiya, Asaka (JP)

(73) Assignee: FUJIFILM Corporation, Tokyo (JP)

( * ) Notice: Subject to any disclaimer, the term of this patent is extended or adjusted under 35 U.S.C. 154(b) by 714 days.

(21) Appl. No.: 10/408,118

(22) Filed: Apr. 8, 2003

(65) Prior Publication Data

US 2003/0222262 A1  Dec. 4, 2003

(30) Foreign Application Priority Data

| | | |
|---|---|---|
| Apr. 8, 2002 | (JP) | P. 2002-105128 |
| May 28, 2002 | (JP) | P. 2002-154147 |
| May 30, 2002 | (JP) | P. 2002-157303 |

(51) Int. Cl.
| | |
|---|---|
| *H04N 3/14* | (2006.01) |
| *H04N 5/335* | (2006.01) |
| *H04N 9/68* | (2006.01) |
| *H04N 9/07* | (2006.01) |

(52) U.S. Cl. ............ 348/315; 348/275; 348/311; 348/234; 348/238

(58) Field of Classification Search ........ 348/315, 348/298, 234, 238, 311; 257/72, 294; 250/208.1
See application file for complete search history.

(56) References Cited

U.S. PATENT DOCUMENTS 4,819,074 A * 4/1989 Suzuki .............. 348/298

(Continued)

FOREIGN PATENT DOCUMENTS

JP  3-15393 A  7/1991

(Continued)

OTHER PUBLICATIONS

Horii et al., A New Configuration of CCD Imager with a Very Low Smear Level. IEEE Electron Device Letters, vol. EDL-2, No. 12 Dec. 1981 , pp. 319-320.*

(Continued)

*Primary Examiner*—David Ometz
*Assistant Examiner*—Wanda M. Negron
(74) *Attorney, Agent, or Firm*—Birch, Stewart, Kolasch & Birch, LLP

(57) ABSTRACT

In a solid-state image pick-up device comprising photoelectric converting devices 3r, 3g and 3b formed at a predetermined array interval in row and column directions on a semiconductor substrate, vertical transfer paths 4a, 4b, 4c, . . . provided in the column direction of the photoelectric converting device and serving to read and transfer a signal charge obtained by the photoelectric converting device, and a shielding film for covering an upper part of the vertical transfer path, a pore 7 is provided in a place corresponding to an imaginary pixel point position in the shielding film. Consequently, an actual signal (an imaginary pixel point charge) corresponding to the amount of a received light on the imaginary pixel point through the pore 7 is stored in the vertical transfer path. Therefore, the imaginary pixel point charge is read from the solid-state image pick-up device before the signal charge is read from the photoelectric converting device, and image data based on the signal charge are corrected by the actual imaginary pixel point charge. Thus, it is possible to generate an image having a high resolution.

19 Claims, 19 Drawing Sheets

U.S. PATENT DOCUMENTS

| | | | |
|---|---|---|---|
| 4,837,628 A * | 6/1989 | Sasaki | 348/220.1 |
| 6,236,434 B1 * | 5/2001 | Yamada | 348/315 |
| 6,295,087 B1 * | 9/2001 | Nohda | 348/234 |
| 6,831,692 B1 * | 12/2004 | Oda | 348/315 |
| 7,071,984 B2 * | 7/2006 | Kawakami | 348/315 |
| 2002/0039144 A1 * | 4/2002 | Yamada | 348/311 |
| 2002/0130957 A1 * | 9/2002 | Gallagher et al. | 348/222 |

FOREIGN PATENT DOCUMENTS

| | | |
|---|---|---|
| JP | 3-185977 A | 8/1991 |
| JP | 3-190392 A | 8/1991 |
| JP | 10-136391 A | 5/1998 |
| JP | 2000-50168 A | 2/2000 |
| JP | 2001-111024 A | 4/2001 |
| JP | 2002-58040 A | 2/2002 |

OTHER PUBLICATIONS

Tamayama et al., High Definition Still Image Processing System Using a New Structure CCD Sensor. IS&T/SPIE Symp. Electronic Imaging, Proc SPIE, vol. 3965, Jan. 2000, pp. 431-436.*

Tabei et al., A New CCD Architecture of High-Resolution and Sensitivity for Color Digital Still Picture. IEEE Transactions on Electron Devices, vol. 38, No. 5, May 1991, pp. 1052-1058.*

* cited by examiner

FIG. 12 (a)    PRIOR ART
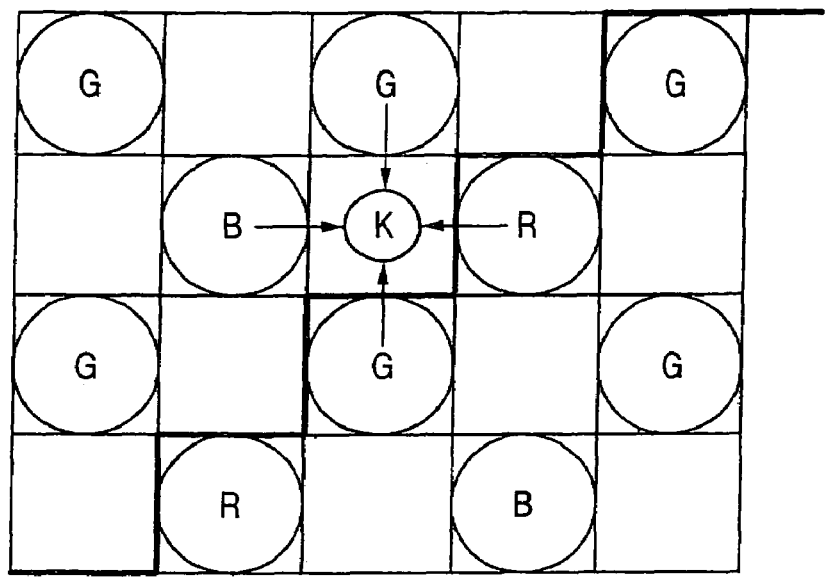
FIG. 12 (b)
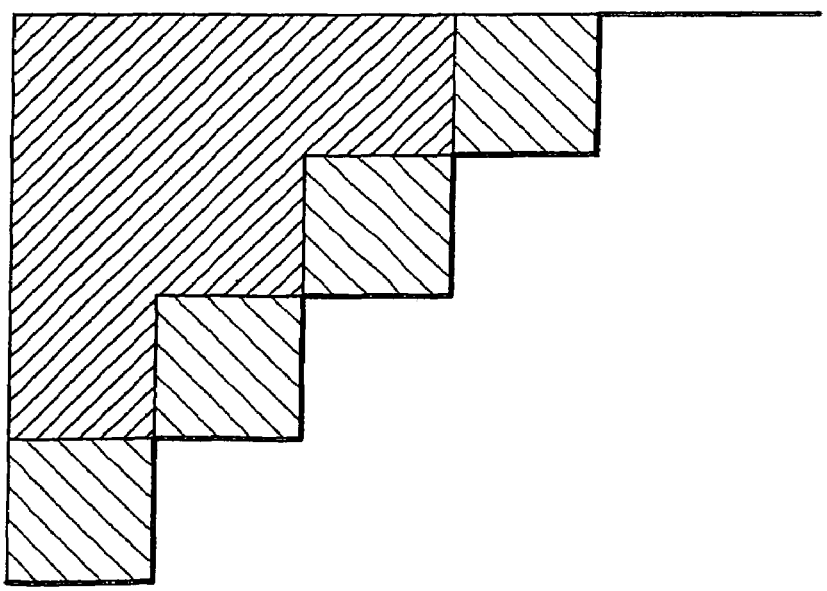

SOLID-STATE IMAGE PICK-UP DEVICE AND DIGITAL STILL CAMERA

BACKGROUND OF THE INVENTION

1. Field of the Invention

The present invention relates to a solid-state image pick-up device, so-called honeycomb CCD, which is to be used in a digital still camera, having a high fineness and picture quality and more particularly to a suitable solid-state image pick-up device for a digital still camera having a focal plane shutter and the digital still camera.

2. Description of the Related Art

FIG. 11 is a plan view showing a conventional solid-state image pick-up device described in JP-A-10-136391, for example. The solid-state image pick-up device is referred to as a so-called honeycomb pixel arrangement, and photodiodes (photoelectric converting devices) having a large number of green (G) color filters are provided at a predetermined interval vertically and horizontally and photodiodes having blue (B) and red (R) color filters are alternately provided in positions shifted by a ½ pitch from each photodiode in each row and column.

In the shown example, octagonal frames described as "R", "G" and "B" indicate red, green and blue color filters respectively, and corresponding photodiodes are provided on the lower side thereof (the lower side of the paper).

An electric charge stored in each photodiode is read onto a vertical transfer path 20 formed on the side of each photodiode as shown in an arrow of "a", and is transferred along the vertical transfer path 20 as shown in an arrow of "b" to reach a horizontal transfer path 21, and is then transferred along the horizontal transfer path 21 as shown in an arrow of "c" and is thus read out of the solid-state image pick-up device.

An image processing device provided in the rear stage of the solid-state image pick-up device which is not shown from the amount of the G signal charges read from a G pixel provided around an "R" pixel in addition to the amount of R signal charges read from an "R" pixel position shown in FIG. 11, for example, and similarly estimates the amount of B signal charges in the R pixel position from the amount of the B signal charges read from a B pixel provided around the R pixel. More specifically, the amounts of signal charges having three colors of R, G and B in each pixel position are obtained and a pick-up image can be acquired with a resolution equal to the number of pixels.

As shown in FIG. 12(a), furthermore, the amount of signal charges in a place kin which a pixel is not provided is estimated by carrying out an interpolating operation over pixel signals of R, G and B therearound. By using an estimated charge amount on the k point (which will be hereinafter referred to as an imaginary pixel point), it is possible to generate image data on the imaginary pixel point, thereby obtaining an image having a higher resolution than the number of pixels of the solid-state image pick-up device as shown in FIG. 12(b).

As described above, conventionally, a signal charge on an imaginary pixel point k is estimated from surrounding pixel signals so that an image having a high resolution can be obtained. However, the amount of the signal charges on the imaginary pixel point k is persistently estimated from the surrounding pixel signals and the estimation value is different from an actual amount of the signal charges. For this reason, there is a problem in that the effect of enhancing a resolution cannot be obtained in all scenes even if the estimation value is used.

A false signal such as a moiré is generated in a solid-state image pick-up device. Turning back to JP-A-10-136391, it has proposed a solid-state image pick-up device capable of increasing an amount of a light to be received to enhance a light receiving efficiency while increasing the integration of a pixel. The solid-state image pick-up device provides a novel structure capable of optimizing the space sampling of an image. This structure is referred to as a so-called honeycomb pixel array.

In this honeycomb pixel array, if a distance between pixels is set to be a pitch, an arrangement is carried out with a shift of a half pitch in a row direction and/or a column direction, for example. With this pixel arrangement, a transfer register in a vertical direction is formed to meander so as to go around each pixel in a solid-state image pick-up device of a CCD (Charge Coupled Device) type. A color filter segment is assigned to each of pixels (actual pixels) present actually. In the pixel (photoreceptor), a light transmitted from the color filter segment is photoelectrically converted and a signal charge having a color attribute is read onto a vertical transfer register in a vertical direction. In the solid-state image pick-up device, a voltage signal obtained by a Q/V conversion, that is, an analog signal is output through a horizontal transfer register which is orthogonal to a vertical transfer direction.

The analog signal is subjected to a signal processing. In consideration of the color of the actual pixel which is supplied, the correlation of pixel data is acquired. In the signal processing, a color is set, and pixel data in a position in which a pixel is not actually present, that is, pixel data in a virtual pixel and pixel data in a pixel having a different color which is actually present are calculated by using pixel data having the same color and a high correlation. A pixel interpolation processing is carried out by using pixel data in such a direction as to have a high correlation. In the pixel interpolation processing, the generation of a false signal can be suppressed. Moreover, the broadband processing of the pixel data is also carried out to increase a resolving power.

In the signal processing, the correlation of pixel data present around an object pixel is decided to carry out a prediction, thereby generating an object virtual pixel. However, the signal processing does not produce a great advantage for all scenes. If the prediction is erroneously carried out, pixel data to be generated cannot reflect a faithful color and gradation, for example. As a result, there is a possibility that a false signal for an original scene might be generated and a resolution might be deteriorated.

SUMMARY OF THE INVENTION

It is an object of the invention to provide a solid-state image pick-up device capable of increasing the precision of an estimation value on an imaginary pixel point and obtaining an image having a high resolution and high precision, and a digital still camera using the solid-state image pick-up device.

In order to attain the object, the invention provides a solid-state image pick-up device comprising a photoelectric converting device formed at a predetermined array interval in row and column directions on a semiconductor substrate, a vertical transfer path provided in the column direction of the photoelectric converting device and serving to read and transfer a signal charge obtained by the photoelectric converting device, and a shielding film for covering an upper part of the vertical transfer path, wherein a pore is provided in a place corresponding to an imaginary pixel point position in the shielding film.

By such a structure, it is possible to actually obtain imaginary pixel point data (an imaginary pixel point charge) corresponding to the amount of a received light on an imaginary pixel point. By using the imaginary pixel point data, it is possible to correct image data based on a signal charge.

In the foregoing, it is preferable that the photoelectric converting device should be arranged in the row direction with a shift of a ½ pitch alternately. By such a structure, the resolution of an image picked up by the solid-state image pick-up device which is referred to as a honeycomb pixel arrangement can be set to be high.

A digital still camera to attain the object comprises the solid-state image pick-up device described above, a focal plane shutter provided in a front part of the solid-state image pick-up device, and an image processing device for reading an imaginary pixel point charge stored in an imaginary pixel point position on the vertical transfer path from the solid-state image pick-up device after the focal plane shutter is closed and then reading a signal charge of the photoelectric converting device from the solid-state image pick-up device, thereby generating image pick-up data from the signal charge and the imaginary pixel point charge. By such a structure, it is possible to obtain a digital still camera capable of picking up an image having a high resolution and rarely having a false signal.

It is another object in this invention to provide a solid-state image pick-up device capable of increasing the precision of an estimation value on an imaginary pixel point and obtaining an image having a high resolution and precision, and a digital still camera using the solid-state image pick-up device.

In order to attain the object, the invention provides a solid-state image pick-up device comprising a photoelectric converting device formed at a predetermined array interval in row and column directions on a semiconductor substrate, a vertical transfer path provided in the column direction of the photoelectric converting device and serving to read and transfer a signal charge by the photoelectric converting device, and a shielding film for covering an upper part of the vertical transfer path, wherein a pore is provided in a place corresponding to an imaginary pixel point position in the shielding film and a storage section for storing an electric charge transferred along the vertical transfer path by a predetermined number of lines and for transferring the electric charge to a horizontal transfer path is provided in a connecting portion of the vertical transfer path and the horizontal transfer path.

By such a structure, it is possible to obtain a static image having a high fineness and picture quality by using information obtained from the photoelectric converting device (main pixel) and information of the imaginary pixel point obtained by a light transmitted through the pore. Moreover, when a dynamic image constituted by only a signal charge of a valid line in each main pixel is to be read out, only the signal charge of the valid line constituting a dynamic image which is transferred along the vertical transfer path is fetched into the storage section so that the transfer speed of the vertical transfer path can be increased. Consequently, it is possible to reduce a smear to be mixed into the dynamic image.

In the foregoing, it is preferable that the photoelectric converting device should be arranged in the row direction with a shift of a ½ pitch alternately. By such a structure, it is possible to obtain a static image having a higher resolution and picture quality by the solid-state image pick-up device of a honeycomb pixel arrangement capable of acquiring an image having a high resolution.

A digital still camera to attain the object comprises the solid-state image pick-up device described above, a mechanical shutter provided in a front part of the solid-state image pick-up device, and control means for driving the vertical transfer path at a higher speed than a transfer speed of a static image and fetching, to the storage section, only a signal charge of a valid line constituting a dynamic image when photographing the dynamic image with the mechanical shutter opened. By such a structure, it is possible to reduce the influence of a smear through a pore also when a dynamic image is photographed by a solid-state image pick-up device provided with the pore.

It is a further object in this invention to provide a solid-state image pick-up device and a solid-state image pick-up device which can sample a signal charge supplied from a pixel with higher precision in a position, thereby predicting the generation of a pixel with high precision.

In order to solve the problems, the invention provides a solid-state image pick-up device comprising a photoreceptor provided in a two-dimensional array and serving to convert an incident light into a signal charge, a plurality of vertical transfer means for transferring the signal charge converted by the photoreceptor in a vertical direction, and horizontal transfer means for transferring the signal charge transferred in a horizontal direction which is orthogonal to the vertical transfer means, an interval between devices provided in the vertical and horizontal directions for each of the photoreceptors being set to be a pitch, and the photoreceptors which are adjacent to each other being provided with a shift of an almost half pitch, and the vertical transfer means being formed to make a pair of two lines between the photoreceptors provided in the horizontal direction and being caused to make a detour every line for the photoreceptors which are adjacent to each other, the device comprising a solid-state image pick-up device in which a photoreceptor provided actually is set to be an actual pixel and a photoreceptor assumed to be provided in a space region surrounded by the actual pixel is set to be a virtual pixel, and vertical transfer means which is shielded and vertical transfer means having an optical opening formed in the vicinity of the virtual pixel are provided regularly, shielding means for regulating an exposure time of the solid-state image pick-up device, and signal processing means for carrying out an interpolation processing by the actual pixel using a signal obtained from the opening of the solid-state image pick-up device as data of the virtual pixel.

In the solid-state image pick-up device according to the invention, the shielding means is opened to receive the incident light by means of each of the photoreceptor and the optical opening for a predetermined time and to photoelectrically convert the same incident light, the incident light is shielded by the shielding means to end the exposure, the signal charge generated in each opening is then read as information corresponding to the position of the virtual pixel to maintain precision to be higher than that of the virtual pixel generated by the interpolation processing, the signal charge of the vertical transfer means is thereafter swept away and the signal charge stored in each of the photoreceptors is read onto the vertical transfer means in accordance with a normal processing procedure, and the virtual pixel is used in the interpolation processing for the real pixel by the signal processing means. Consequently, it is possible to enhance the precision for each pixel which is obtained by the interpolation.

In order to solve the problems, moreover, the invention provides a solid-state image pick-up device comprising a photoreceptor provided in a two-dimensional array and serving to convert an incident light into a signal charge, a plurality of vertical transfer means for transferring the signal charge converted by the photoreceptor in a vertical direction, and horizontal transfer means for transferring the signal charge transferred in a horizontal direction which is orthogonal to the vertical transfer means, an interval between devices provided in the vertical and horizontal directions for each of the photoreceptors being set to be a pitch, and the photoreceptors which are adjacent to each other being provided with a shift of an almost half pitch, and the vertical transfer means being formed to make a pair of two lines between the photoreceptors provided in the horizontal direction and being caused to make a detour every line for the photoreceptors which are adjacent to each other, wherein a photoreceptor provided actually is set to be an actual pixel and a photoreceptor assumed to be provided in a space region surrounded by the actual pixel is set to be a virtual pixel, and first vertical transfer means which is shielded as the vertical transfer means and second vertical transfer means having an optical opening formed in the vicinity of the virtual pixel are provided regularly, and the first vertical transfer means is provided in such a manner that an adjacent photoreceptor to the first vertical transfer means maintains the same relationship with a color array pattern of a color filter segment to be color separated which covers an adjacent photoreceptor to the vertical transfer means by aiming at the same color array pattern.

In the solid-stage image pick-up device according to the invention, the signal charge generated in each opening of the second vertical transfer means is read as a signal charge corresponding to the position of the virtual pixel, the signal charge of the vertical transfer means is then swept away, the signal charge stored in each of the photoreceptors is read onto the vertical transfer means in accordance with a normal processing procedure and is thus transferred to read a signal in static image photographing, and the actual data obtained from the signal charge supplied from the opening positioned in the vicinity of the virtual pixel as well as the signal charge supplied from the photoreceptor provide information with higher precision than that of the estimation data of the virtual pixel generated by the interpolation, while vertical thinning is carried out to read and transfer the signal charge, thereby reading a signal in dynamic image photographing. In the signal reading to be carried out in the dynamic image photographing, normal data maintaining the color array pattern can be obtained for horizontally thinned dynamic image photographing by using only data corresponding to any of the read signal charges which is obtained from the first vertical transfer means.

DESCRIPTION OF THE PREFERRED EMBODIMENTS

The first embodiment in this invention will be described below with reference to the drawings.

Figure 1:
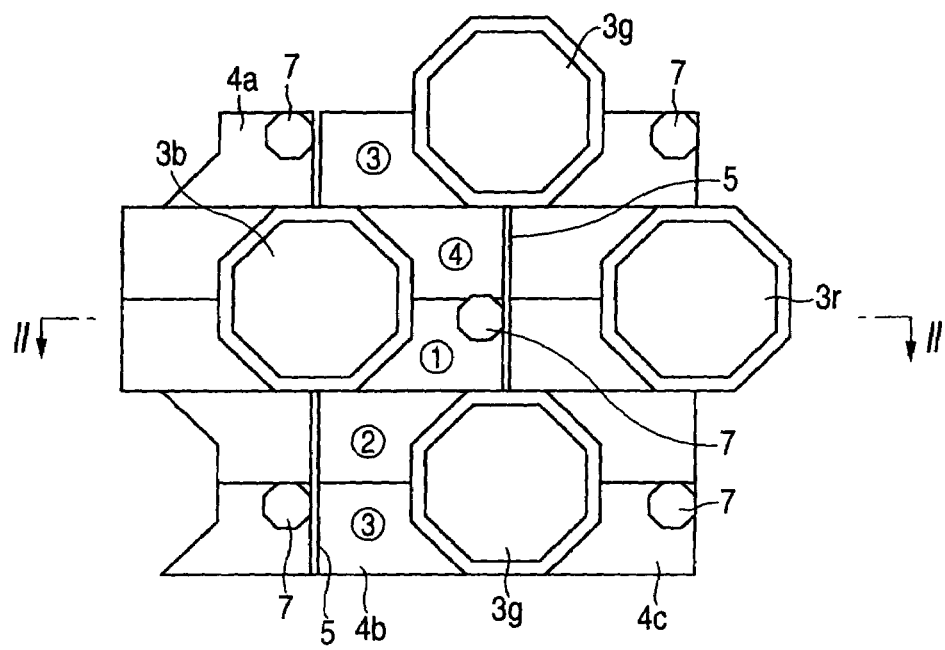
FIG. 1 is a partial plan view showing a solid-state image pick-up device according to the first embodiment of the invention.
Figure 2:
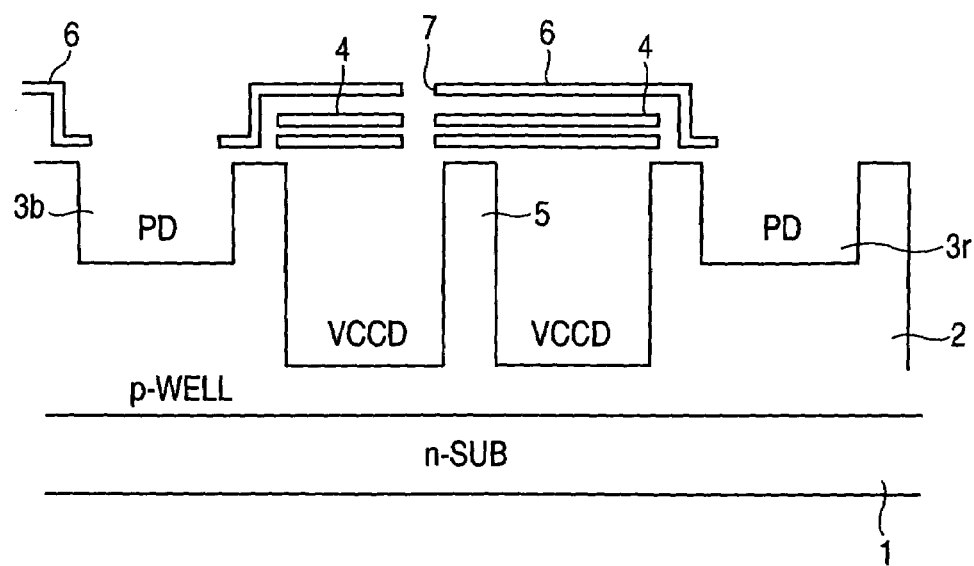
FIG. 2 is a sectional view taken along a line II-II in FIG. 1.

FIG. 1 is a partial plan view showing a solid-state image pick-up device (a CCD in this example) mounted on a digital still camera according to the embodiment of the invention, and FIG. 2 is a sectional view taken along a line II-II in FIG. 1. A p well 2 is formed on an n-type semiconductor substrate 1 of the solid-state image pick-up device according to the embodiment, and pixels (photodiodes PD) 3r, 3g and 3b of a honeycomb arrangement are formed on the p well 2. A color filter corresponding to each pixel color is provided on each of the photodiodes PD (photoelectric converting devices), which is not shown in FIG. 2.

Vertical transfer paths 4a, 4b, 4c, . . . extended zigzag in a column direction are formed between the pixels 3r, 3g and 3b, and two transfer electrodes constituting the vertical transfer paths are formed on both sides of each pixel (indicated as ①, ②, ③ and ④ in FIG. 1). When a predetermined voltage is applied to the transfer electrode, a potential well is formed on the p well 2 in the lower position of the transfer electrode as shown in FIG. 2.

In the example shown in FIG. 1, the signal charge of a pixel 3b is read onto the vertical transfer path 4b and the signal charge of a pixel 3g is read onto the vertical transfer path 4c, and they are transferred. The signal charge to be transferred is read from the pixel 3b onto a potential well formed in the lower part of the transfer electrode ① the reading is carried out by applying a reading voltage to a reading electrode which is not shown), for example.

Next, a predetermined voltage is applied to the transfer electrode ② to form a potential well and the application of the predetermined voltage to the transfer electrode ① is stopped to eliminate the potential well. Consequently, the signal charge is moved from the lower position of the transfer electrode ① to the lower position of the transfer electrode ②. Subsequently, the signal charge proceeds to the transfer electrode ③ and is then transferred to a horizontal transfer path shown in FIG. 7 or 8 in the same manner. More specifically, the predetermined voltage is applied to the transfer electrodes ①, ②, ③ and ④ in order so that the signal charge is transferred in a vertical direction in the example shown in FIG. 1.

In the examples shown in FIGS. 1 and 2, the adjacent vertical transfer paths 4b and 4c are separated from each other through a channel stop 5. Consequently, the potential well provided between the vertical transfer paths 4b and 4c is separated. The other adjacent vertical transfer paths are also separated in the same manner.

In the case in which a signal charge is to be transferred along the vertical transfer paths 4a, 4b, . . . , a noise is mixed into the signal charge to deteriorate picture quality when a light is incident on the potential well. For this reason, a shielding film 6 is provided on the transfer electrodes 4a, 4b, . . . as shown in FIG. 2 in such a manner that the light is not incident on the potential well during the transfer of the signal charge.

In the embodiment, a pore (hole) 7 is opened in a position to be an almost middle position of four pixels provided therearound in the shielding film 6 and the transfer electrode ① provided thereunder, that is, a position of an imaginary pixel point in which a photodiode is not present but image data are created by using the signal charge of surrounding pixels (photodiodes) in such a manner that the light is incident on the potential well of the transfer electrode ①.

When a noise made by the light incidence is mixed into the signal charge which is being transferred, the picture quality is deteriorated as described above. However, it is premised that the solid-state image pick-up device according to the embodiment is provided in a digital still camera mounting a focal plane shutter thereon. Since a shutter is closed during the transfer of the signal charge, an external light does not enter the potential well.

Figure 3:
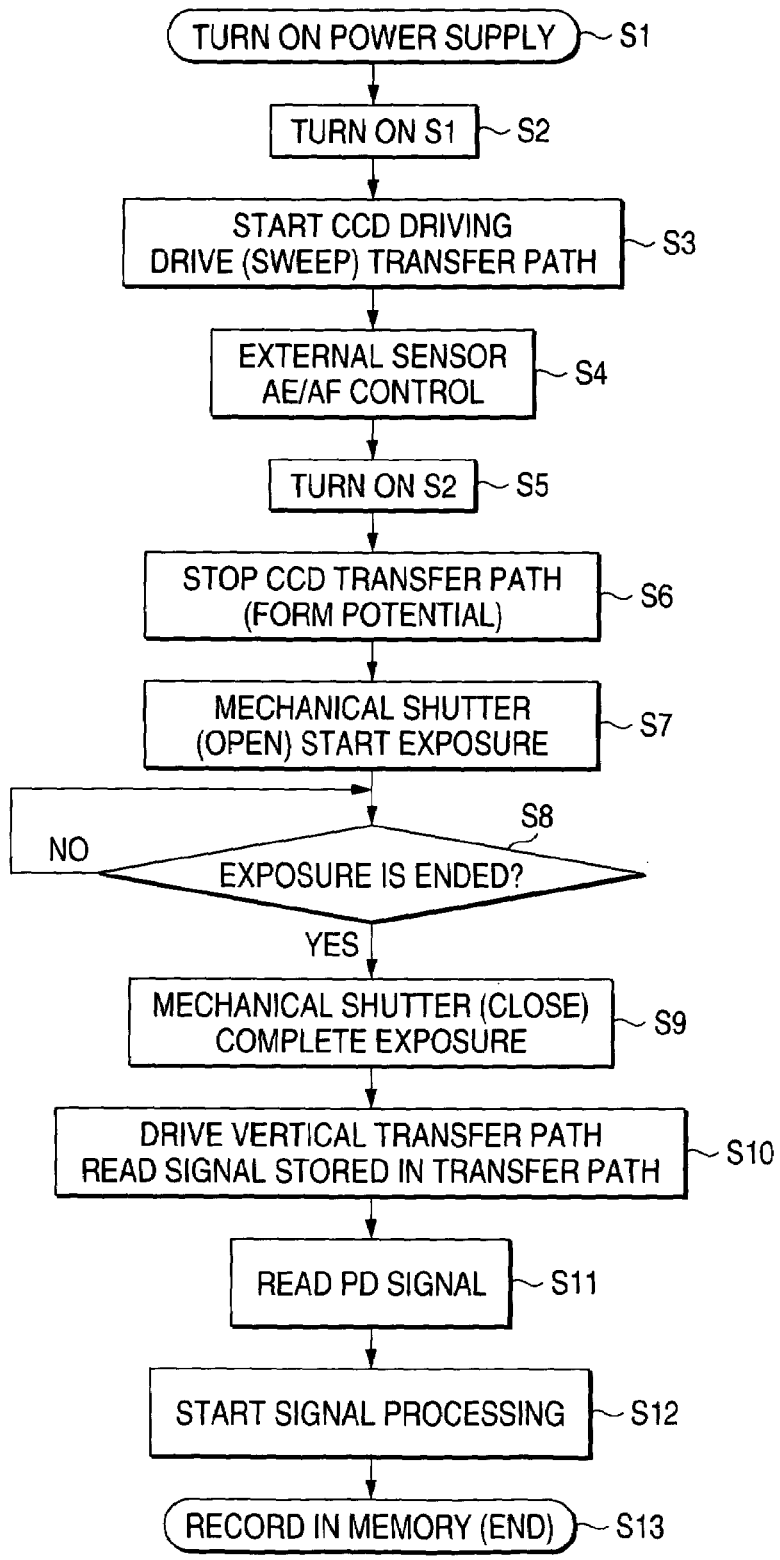
FIG. 3 is a flowchart showing an operation procedure for a digital still camera according to the first embodiment.
Figure 4:
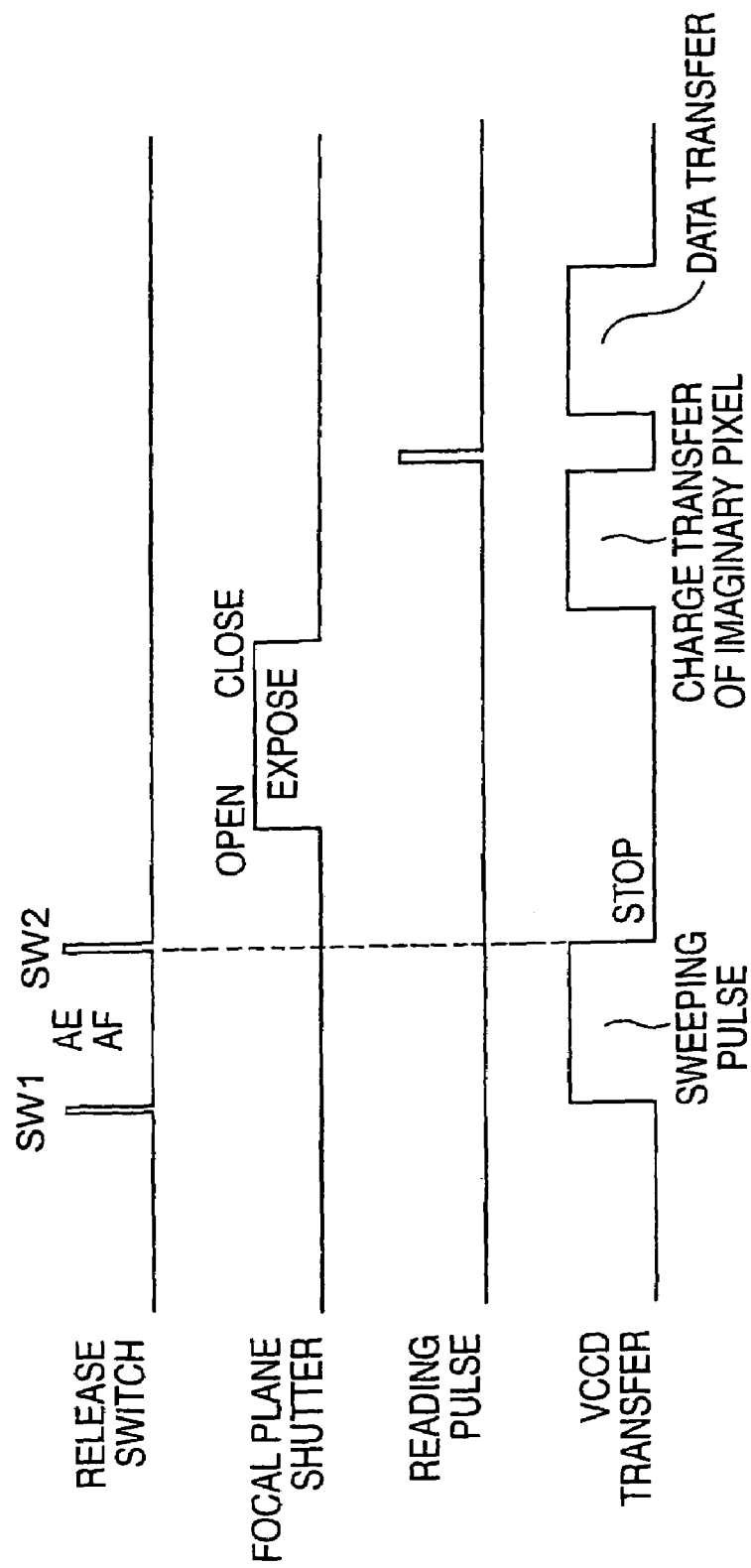
FIG. 4 is a timing chart corresponding to the flowchart shown in FIG. 3.

FIG. 3 is a flowchart showing an image pick-up procedure in the digital still camera comprising the solid-state image pick-up device and FIG. 4 is a timing chart thereof. An ordinary digital still camera usually starts photographing by means of an electronic shutter and ends the photographing by means of a mechanical shutter. The digital still camera according to the embodiment mounts the focal plane shutter as described above and is characterized in that a process from the start of photographing to the end of the photographing is carried out by mechanical control through the focal plane shutter.

When a power supply is turned ON to pick up an image by means of the digital still camera (a step S1) and a photographer touches a two-stage type shutter release button by fingers, an SW1 switch is first turned ON (a step S2). Consequently, the driving operation of the solid-state image pick-up device is started and a high-speed sweeping pulse is applied to each of the transfer electrodes ①, ②, ③ and ④ of the vertical transfer path in order so that a noise charge remaining in the vertical transfer path is swept away (a step S3). Simultaneously with the sweeping processing, an automatic exposure processing and an autofocus processing are carried out according to an external sensor at a step S4.

Subsequently, when the photographer completely presses the shutter release button, an SW2 switch is turned ON (a step S5). Consequently, the sweeping processing of the vertical transfer path is ended and a predetermined voltage is applied to the transfer electrode ① having the pore 7 formed thereon and a potential well is formed under the transfer electrode ① (a step S6).

Next, the first film of the focal plane shutter runs to start an exposure (a step S7) and it is decided whether a preset exposure time is over or not (a step S8). When it is decided that the exposure is completed, the second film of the focal plane shutter runs to actually end the exposure (a step S9).

By the exposure, the signal charge of a static image corresponding to the exposure time is stored in the photodiode PD, and at the same time, an electric charge corresponding to the exposure time is stored in the potential well of the transfer electrode ①. The electric charge entering the potential well of the transfer electrode ① is equivalent to a signal charge on an imaginary pixel point surrounded by four pixels. The electric charge is read from the solid-state image pick-up device and can be thereby utilized as a signal charge on the imaginary pixel point (which will be hereinafter referred to as imaginary pixel point data).

In the embodiment, the imaginary pixel point data are previously transferred along a vertical transfer path and are then transferred along a horizontal transfer path to read the electric charge from the solid-state image pick-up device (a step S10) and to store the same electric charge in a memory.

Next, a reading pulse is applied to a reading electrode which is not shown, the signal charge (image data) of the pixel (photodiode PD) is read onto the vertical transfer path, and is transferred to the vertical transfer path and the horizontal transfer path and is then read from the solid-state image pick-up device (a step S11) and is stored in the memory.

At a next step S12, an image processing is carried out by using the image data stored in the memory and the imaginary pixel point data, and the image data generated as a processing result are recorded in the memory (a step S13) to end the processing.

As a method of using the imaginary pixel point data, for example, a signal charge on the imaginary pixel point is estimated by using the signal charge of a photoelectric converting device and a value obtained by the estimation is corrected by using the imaginary pixel point data in the same manner as in the conventional art. Alternatively, since the imaginary pixel point data are signal charges which are not transmitted through a color filter, they are set to luminance data and the image data read from the pixel are corrected by the luminance data. Thus, various methods can be proposed for the method of using the imaginary pixel point data.

In the embodiment, thus, it is possible to obtain actual information on the imaginary pixel point with such a simple structure that a hole is opened in the position of the imaginary pixel point. Consequently, it is possible to reduce a false signal by using the imaginary pixel point data or increasing the resolution of an image.

In the embodiment, the pore 7 is provided in a position which is slightly shifted from the middle position of four pixels as shown in FIG. 1. The reason is that the transfer of the imaginary pixel point data is to be carried out easily. However, it is also possible to provide the position of the pore 7 in the true middle position of four surrounding pixels.

Figure 5:
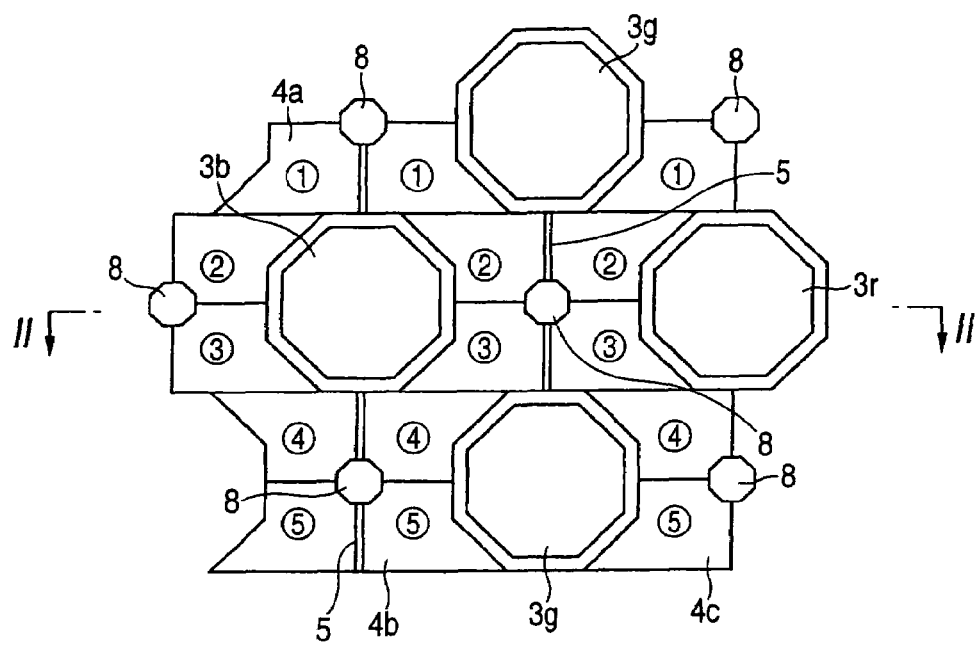
FIG. 5 is a partial plan view showing a solid-state image pick-up device according to second embodiment of the invention.

FIG. 5 is a plan view showing an example in which a pore 8 is provided in the center of the four surrounding pixels 3*r*, 3*g* and 3*b*. The transfer electrode of each of the vertical transfer paths 4*a*, 4*b* and 4*c* is represented by ①, ②, ③, ④ and ⑤ as shown in FIG. 5. In the case in which the imaginary pixel point data are to be stored in the potential well through the pore 8, a predetermined voltage is applied to the transfer electrodes ①, ③ and ⑤ to form the potential well and to prevent the potential well from being formed on the transfer electrodes ② and ④.

Consequently, the imaginary pixel point data stored through the pore 8 are stored in the transfer electrodes ①, ③ and ⑤. In this case, the imaginary pixel point data are separately stored in two adjacent potential wells partitioned by the channel stop 5. After the transfer, therefore, a value obtained by adding two adjacent imaginary pixel point data becomes true imaginary pixel point data.

In this case, moreover, the potential well is formed every other transfer electrode in a vertical transfer direction. Therefore, the imaginary pixel point data are transferred through a so-called accordion transfer in order from the vertical transfer electrode on the horizontal transfer path side.

Next, the second embodiment in this invention will be described below with reference to the drawings.

Figure 6:
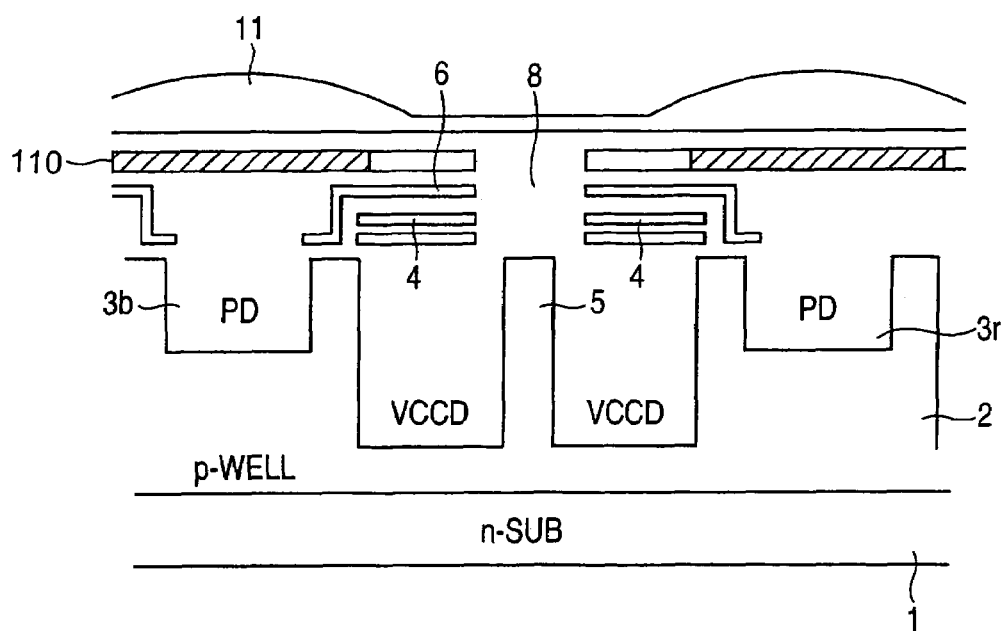
FIG. 6 is a sectional view taken along a line II-II in FIG. 1.
Figure 7:
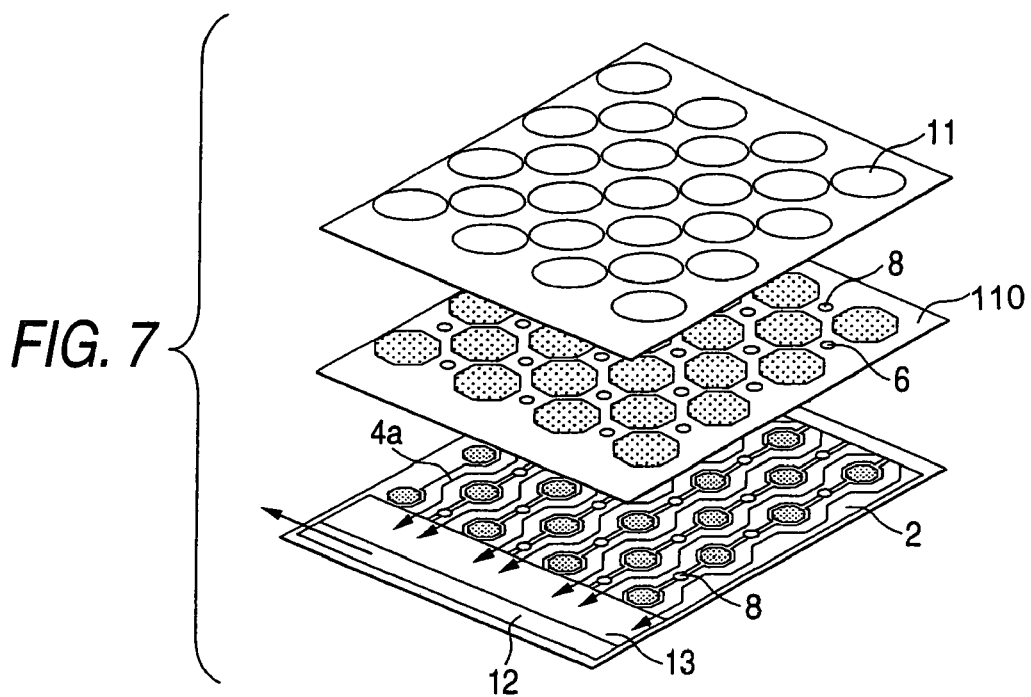
FIG. 7 is an exploded view showing the solid-state image pick-up device illustrated in FIG. 1.

FIG. 5 is a partial plan view showing a solid-state image pick-up device (a CCD in this example) mounted on a digital still camera according to the embodiment of the invention, and FIG. 6 is a sectional view taken along a line II-II in FIG. 5. A p well 2 is formed on an n-type semiconductor substrate 1 of the solid-state image pick-up device according to the embodiment, and pixels (photodiodes PD) 3*r*, 3*g* and 3*b* of a honeycomb arrangement are formed on the p well 2. As shown in FIG. 6, moreover, a color filter 110 corresponding to each pixel color and a microlens 11 are provided in the upper part of each photodiode PD (photoelectric converting device). FIG. 7 is an exploded view thereof.

Vertical transfer paths 4*a*, 4*b*, 4*c*, . . . extended zigzag in a column direction are formed between the pixels 3*r*, 3*g* and 3*b*, and two transfer electrodes constituting the vertical transfer paths are formed on both sides of each pixel (indicated as ①, ②, ③, ④ and ⑤ in FIG. 5). When a predetermined voltage is applied to the transfer electrode, a potential well is formed on the p well 2 in the lower position of the transfer electrode as shown in FIG. 6.

In the example shown in FIG. 5, the signal charge of a pixel 3*b* is read onto the vertical transfer path 4*b* and the signal charge of a pixel 3*g* is read onto the vertical transfer path 4*c*, and they are transferred. The signal charge to be transferred is read from the pixel 3*b* onto a potential well formed in the lower part of the transfer electrode ③ (the reading is carried out by applying a reading voltage to a reading electrode which is not shown), for example.

Next, a predetermined voltage is applied to the transfer electrode ④ to form a potential well and the application of the predetermined voltage to the transfer electrode ③ is stopped to eliminate the potential well. Consequently, the signal charge is moved from the lower position of the transfer electrode ③ to the lower position of the transfer electrode ④. Subsequently, the signal charge proceeds to the transfer electrode ⑤ and is then transferred to a horizontal transfer path in the same manner. More specifically, the predetermined voltage is applied to the transfer electrodes ①, ②, ③, ④ and ⑤ in order so that the signal charge is transferred in a vertical direction in the example shown in FIG. 5.

In the examples shown in FIGS. 5 and 6, the adjacent vertical transfer paths 4*b* and 4*c* are separated from each other through a channel stop 5. Consequently, the potential well provided between the vertical transfer paths 4*b* and 4*c* is separated. The other adjacent vertical transfer paths are also separated in the same manner.

In the case in which a signal charge is to be transferred along the vertical transfer path, a noise charge is mixed into the signal charge to deteriorate picture quality when a light is incident on the potential well. For this reason, a shielding film 6 is provided on the transfer electrodes 4*a*, 4*b*, as shown in FIG. 6 in such a manner that the light is not incident on the potential well during the transfer of the signal charge.

In the embodiment, however, a pore (hole) 8 is opened in a position to be a middle position of four pixels provided therearound in the color filter 110, the shielding film 6 and the transfer electrode provided thereunder, that is, a position of an imaginary pixel point k in which a photodiode is not present but image data are created by using the signal charge of surrounding pixels (photodiodes PD) in such a manner that the light is incident on the potential well of the transfer electrode 4.

When a noise charge made by the light incidence is mixed into the signal charge which is being transferred, the picture quality is deteriorated in the embodiment, however, the transfer is carried out with the mechanical shutter closed when the signal charge for a static image is read out of the photodiode and is thus transferred as will be described below. Consequently, the noise is not mixed into the signal charge.

Figure 8:
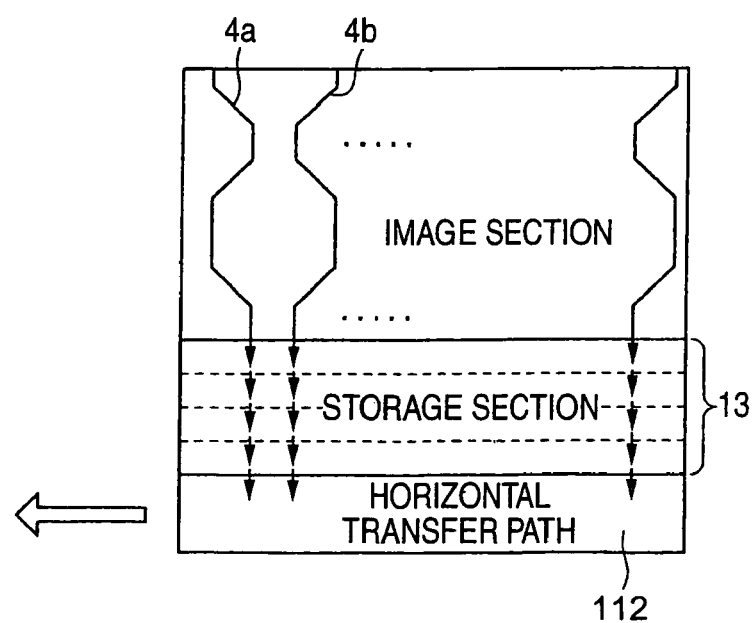
FIG. 8 is a diagram showing the relationship among a vertical transfer path, a storage section and a horizontal transfer path in the solid-state image pick-up device illustrated in FIG. 5.

The signal charge for a dynamic image is to be transferred with the mechanical shutter opened. For this reason, a noise charge is inevitably mixed by a light incidence. In the embodiment, however, the transfer speed of the vertical transfer path is increased as will be described below in order to lessen the noise charge, and furthermore, a storage section 13 is provided between the vertical transfer paths 4*a*, 4*b*, . . . and a horizontal transfer path 112 as shown in FIG. 8. The storage section 13 can store data for four lines in the shown example.

The storage section 13 has such a structure as to store the signal charges of a line which is transferred from the vertical transfer paths 4*a*, 4*b*, . . . and to sequentially shift the signal charges to the horizontal transfer path 112. In the case in which a static image is picked up, the signal charges of all pixels are read onto the vertical transfer paths and are sequentially transferred to the horizontal transfer path 112 through the storage section 13.

On the other hand, a dynamic image does not need an image having a high fineness differently from the static image. For this reason, a one-frame image for the dynamic image is constituted by only the thinned pixel data. For example, a signal charge for a pixel in a first row, a signal charge for a pixel in a fourth row, . . . are read out to constitute each frame image of the dynamic image. In this case, the signals of valid lines corresponding to a second row, a third row, . . . a fifth row, a sixth row, . . . are also transferred along the vertical transfer paths 4a, 4b, . . . . Therefore, the signals of the invalid lines are discarded toward the back side of the substrate of the solid-state image pick-up device immediately before entering the storage section 13 and only the signal of the valid line is fetched into the storage section 13 and is shifted up to the horizontal transfer path 112.

By increasing the transfer speed of the vertical transfer path, thus, it is possible to shorten a time required for an exposure to a light through the pore 8. Consequently, it is possible to reduce a noise charge entering the vertical transfer path through the pore 8. For example, if the number of lines to be read as a dynamic image for all lines of the main pixel of the solid-state image pick-up device is set to be ¼ and the number of lines to be provided in the storage section 13 is set to be four, the transfer speed of the vertical transfer path can be increased to be four times as high as an ordinary transfer speed for reading a static image. Consequently, a smear can be reduced to be ¼.

Figure 9:
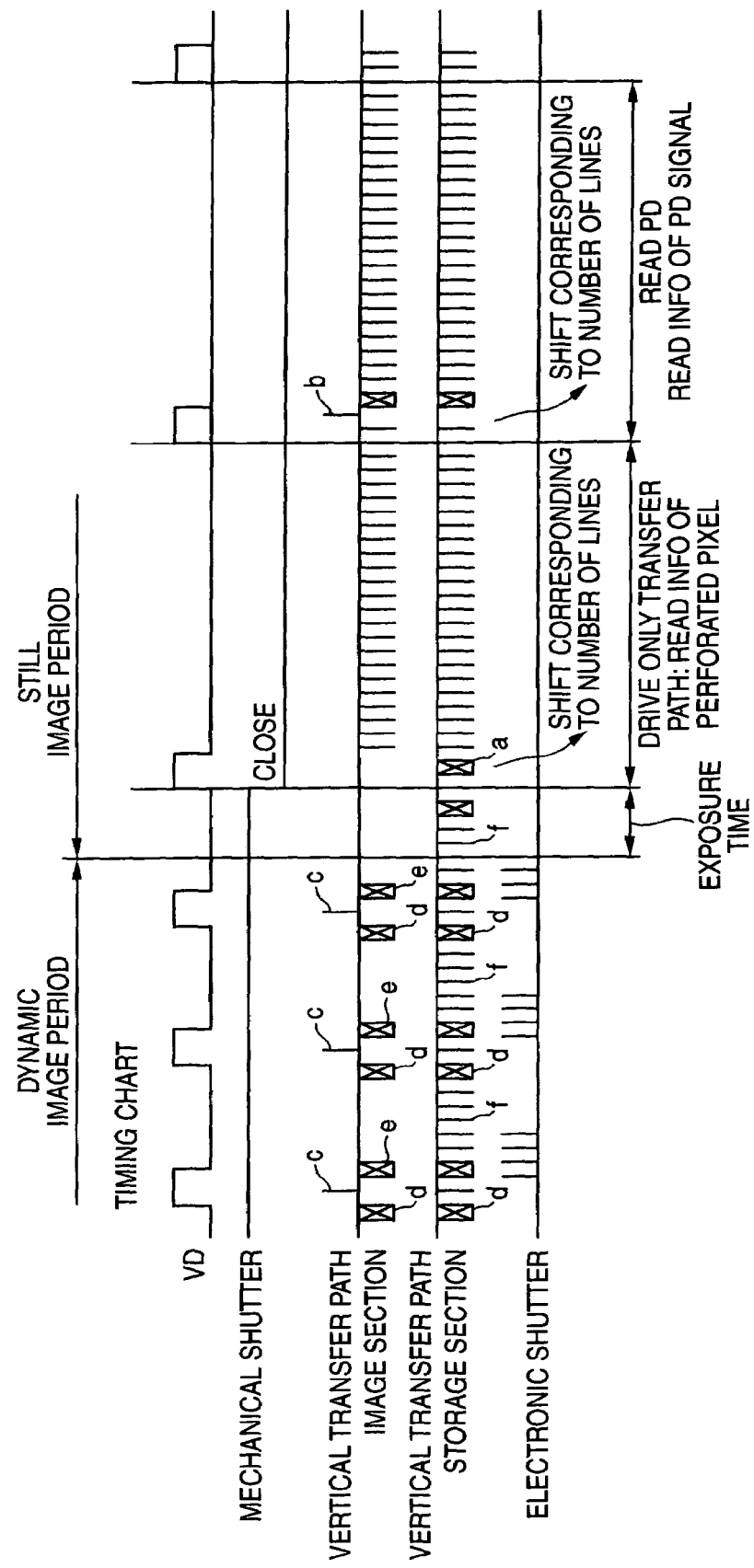
FIG. 9 is an operation timing chart showing the solid-state image pick-up device according to the second embodiment of the invention.
Figure 10:
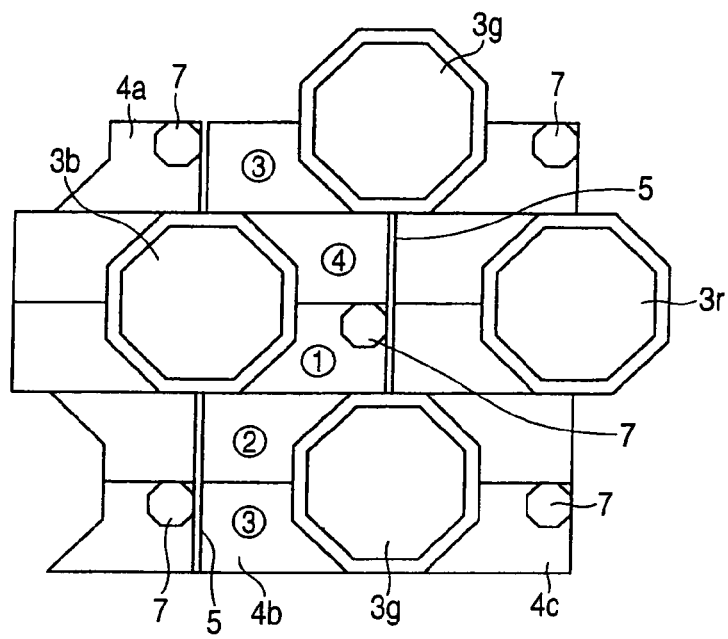
FIG. 10 is a partial plan view showing a solid-state image pick-up device according to the third embodiment of the invention.
Figure 11:
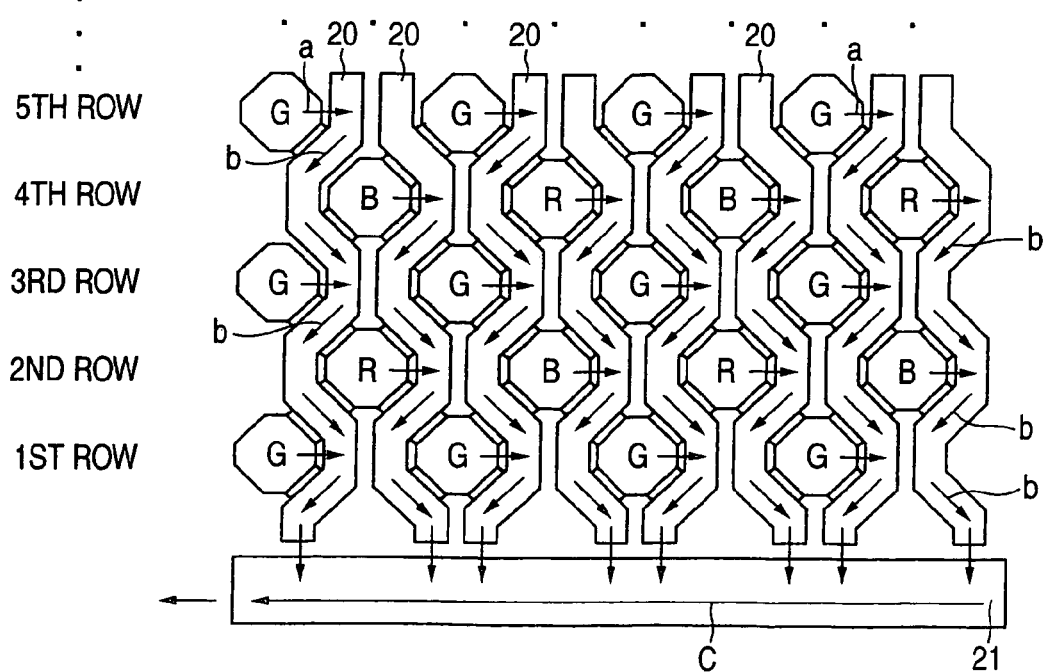
FIG. 11 is a plan view showing a solid-state image pick-up device in which a honeycomb pixel is arranged according to the related art, and FIGS. 12(*a*) and 12(*b*) show the explanatory views of a data interpolation on an imaginary pixel point.

FIG. 9 is a chart showing an image pick-up timing in the digital still camera comprising the solid-state image pick-up device. In accordance with the timing chart, description will be given to the fetch of a static image and that of a dynamic image. First of all, the fetch of a static image will be described.

A static image is fetched by reading a signal charge stored in each pixel (photodiode) during an exposure time from the "open" of an electronic shutter to the "close" of a mechanical shutter. In the solid-state image pick-up device according to the embodiment, however, an electric charge stored in the imaginary pixel point is also utilized. Therefore, a signal remaining in the storage section 13 is first shifted by the number of lines with a pulse "a" shown in FIG. 9 and is discarded by closing the mechanical shutter.

Next, a transfer is carried out with a transfer pulse having a predetermined cycle by synchronizing the vertical transfer paths 4a, 4b, . . . with the storage section 13, and the electric charge stored in the imaginary pixel point is transferred up to the horizontal transfer path 112, and is then transferred along the horizontal transfer path 112 and is thus read out of the solid-state image pick-up device.

When an electric charge is to be stored in the imaginary pixel point so as to be stored well under the corresponding transfer electrode, the driving pulse of each transfer electrode is brought into a stop state with a potential well formed under the corresponding transfer electrode (the transfer electrodes ② and ④ in FIG. 5, for example). In this case, the sum of the electric charges stored in the left and right transfer electrodes ② divided by the channel stop 5 represents the electric charges stored in the imaginary pixel point.

When the electric charge in the imaginary pixel point is completely read out, a reading pulse "b" is then applied to a reading gate and the signal charge of the photodiode is read onto the vertical transfer path. Thereafter, the signal charge is transferred by a transfer pulse having a predetermined cycle and is read out of the solid-state image pick-up device.

As a method of using the imaginary pixel point data, for example, a signal charge on the imaginary pixel point is estimated by using the signal charge of a photoelectric converting device and a value obtained by the estimation is corrected by using the imaginary pixel point data in the same manner as in the conventional art. Alternatively, since the imaginary pixel point data are signal charges which are not transmitted through a color filter, they are set to be luminance data and the image data read from the pixel are corrected by the luminance data. Thus, various methods can be proposed for the method of using the imaginary pixel point data.

When the size of the pore 8 is set to be smaller than the area of the main pixel (photodiode PD), an image obtained from the main pixel has a high sensitivity and an image obtained through the pore 8 (imaginary pixel) has a low sensitivity. Therefore, it is possible to generate an image having a wide dynamic range from these two images. In other words, it is possible to increase the dynamic range of the digital still camera.

In the embodiment, thus, actual information on the imaginary pixel point can be obtained with such a simple structure that a hole is opened in the position of the imaginary pixel point. Consequently, a false signal can be reduced by using the imaginary pixel point data or the resolution of an image can be increased.

Next, the fetch of a dynamic image will be described. In the case in which a dynamic image is to be picked up, the mechanical shutter is "open" and an exposure time is determined by only the electronic shutter, and a signal charge is stored in each pixel. The signal charge of a pixel constituting the dynamic image is read onto the vertical transfer path with a reading pulse "c" which is synchronous with a vertical synchronization signal VD. Prior to each pulse "c", noises remaining on the vertical transfer path 4 and the storage section 13 are first swept away with a sweeping pulse "d" and the signal charge of the main pixel of the valid line constituting the dynamic image is then read onto the vertical transfer path 4 with the reading pulse "c".

Next, the signal charge read onto the vertical transfer path 4 is transferred to the storage section 13 at a high speed with a high-speed transfer pulse "e" and only the signal charge of the valid line constituting the dynamic image is fetched into the storage section 13. Then, the storage section 13 shifts the signal charge to the horizontal transfer path 112 with a transfer pulse "f" having a predetermined cycle and the signal charge transferred along the horizontal transfer path 112 is read out of the solid-state image pick-up device.

The transfer pulse "e" for transferring the signal charge read onto the vertical transfer path to the storage section 13 is a high-speed pulse. Therefore, the signal charge is delivered to the storage section 13 in a short time. If the time is short, the amount of noise charges passing through the pore 8 during a transfer in the vertical transfer path is lessened so that the picture quality of the dynamic image is not deteriorated. Consequently, a smear entering the dynamic image is lessened, and furthermore, a deterioration in the picture quality of an image displayed in a display section on the back of the digital still camera for displaying a dynamic image is also reduced.

In the embodiment, there has been described the example in which the pore 8 is provided in the center of the four surrounding pixels 3r, 3g and 3b. However, the pore 8 does not need to be always provided in the center of the four surrounding pixels 3r, 3g and 3b and can also be provided in a shifted position in order to simply carry out the transfer. In FIG. 6, the pore 7 is provided in a slightly shifted position to enter one transfer electrode. Thus, the electric charge on the imaginary pixel point can be stored in one of the four transfer electrodes in the transfer direction of the vertical transfer path and the transfer pulse of the imaginary pixel point data can easily be created.

Next, the fourth embodiment of a solid-state image pick-up device according to the invention will be described in detail with reference to the accompanying drawings.

In the embodiment, the solid-state image pick-up device according to the invention is applied to a digital camera 10. The illustration and description of portions which are not directly related to the invention will be omitted. In the following description, a signal is indicated as the reference numeral of a connecting line on which it appears.

Figure 13:
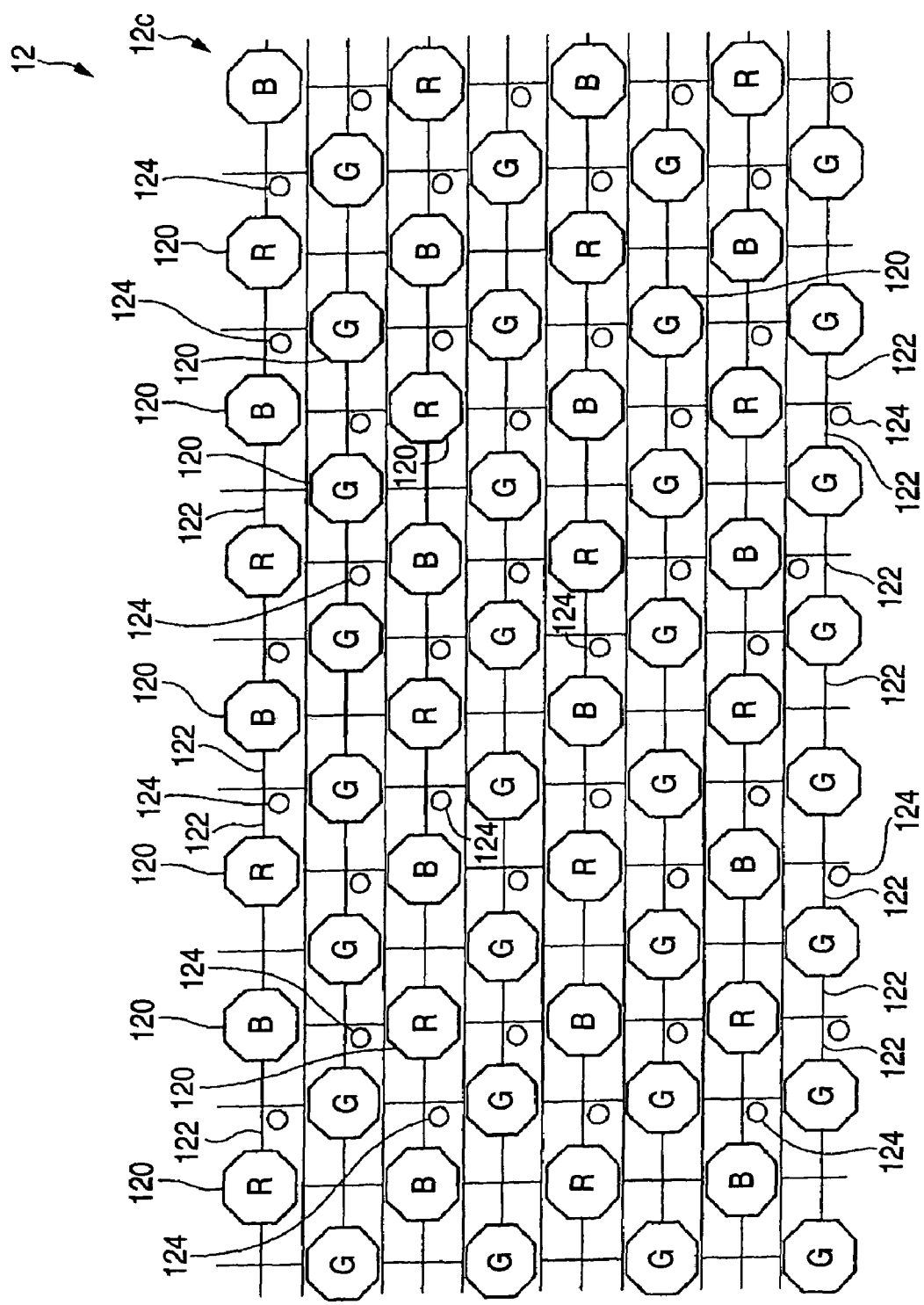
FIG. 13 is an explanatory view showing the positional relationship among a photoreceptor, a vertical transfer register and an incidence hole in a solid-state image pick-up device to be used in an image pick-up section in a digital camera according to the fourth embodiment.

The digital camera 10 is characterized by the solid-state image pick-up device of an image pick-up section 12 as shown in FIG. 13. The image pick-up section 12 of FIG. 13 represents the array of a photoreceptor 120 for carrying out a photoelectric conversion seen from the incidence side of an incident light. A horizontal transfer register in the image pick-up section 12 is formed in the same manner as that in the conventional art and illustration is therefore omitted.

If a spacing between the photoreceptors (pixels) in a horizontal or vertical direction is set to be a pixel pitch, one of the photoreceptors 120 which is adjacent to the other photoreceptor 120 is provided in a position indicative of an almost half of a pixel pitch in each direction. Moreover, vertical transfer registers 122 and 122 for two lines are formed between the pitch of the photoreceptors 120, respectively. Such an array of the photoreceptors is a so-called honeycomb array. In the case in which the photoreceptor 120 is set to be an actual pixel which is actually present, a region having no photoreceptor surrounded by four photoreceptors 120 is set to be a virtual pixel region in the image pick-up section 12.

In the image pick-up section 12 to be one of the features according to the invention, an incidence hole 124 is interposed between four existing photoreceptors 120 and is thus formed on a left one of the vertical transfer registers 122 and 122 in the two lines. If the incidence hole 124 is formed in coincidence with a virtual pixel, a signal charge cannot be held. For this reason, the incidence hole 124 is formed in the vicinity of the virtual pixel. Moreover, the incidence hole 124 is not formed on the vertical transfer register 122 in one line but the vertical transfer registers 122 and 122 in two lines in consideration of the array pattern of a color filter segment. Characters R, G and B described in the photoreceptor 120 indicate the color of the color filter segment. The array pattern of the color filter segment to be used is a G square RB perfect checker pattern. The incidence hole 124 is formed with such a relationship that three lines are set to be a device. Further description will be given later.

Figure 14:
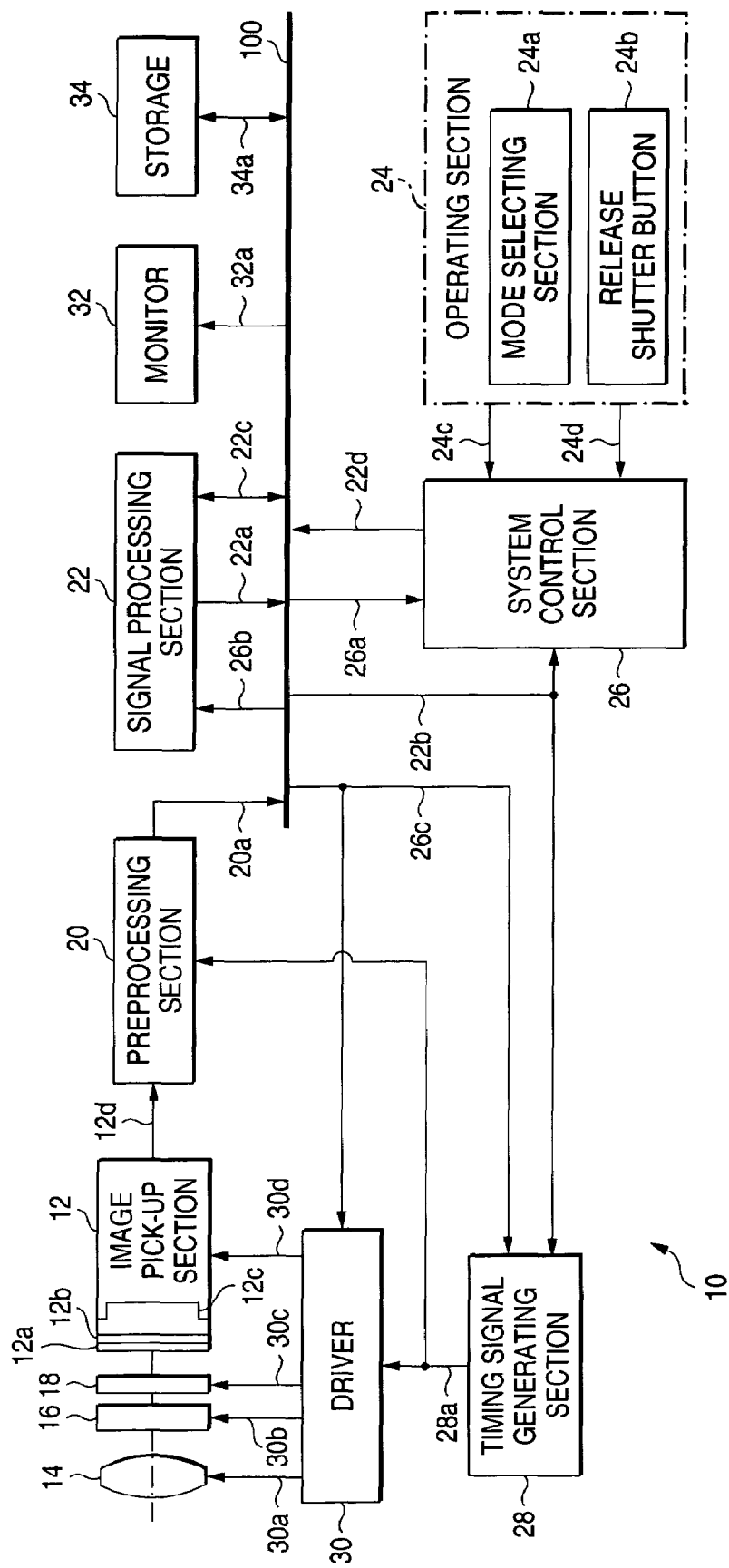
FIG. 14 is a block diagram showing the schematic structure of the digital camera to which the solid-state image pick-up device according to the fourth embodiment.

The digital camera 10 comprises an optical lens system 14, a diaphragm regulating mechanism 16, a mechanical shutter 18, a preprocessing section 20, a signal processing section 22, an operating section 24, a system control section 26, a timing signal generating section 28, a driver 30, a monitor 32 and a storage 34 in addition to the image pick-up section 12 (see FIG. 14). The optical lens system 14 includes a zoom mechanism for regulating the angle of view of a field and an automatic focus (AF) regulating mechanism for automatically displacing and regulating the arrangement of a plurality of optical lenses and adjusting an object to have a focused positional relationship, which are not shown. Each of the mechanisms is provided with a motor for moving the optical lens in the position described above. These mechanisms are operated in response to a driving signal 30*a* supplied from the driver 30 to each of the motors.

The diaphragm regulating mechanism 16 is an AE (Automatic Exposure) regulating mechanism for regulating an amount of an incident light which is not specifically shown, and serves to rotate a ring section in response to a driving signal 30*b* sent from the driver 30. The ring section causes blades to partially overlap and causes an iris to have a round shape, and forms the iris in such a manner that an incident luminous flux is transmitted therethrough. Thus, the diaphragm regulating mechanism 16 changes the aperture of the iris. The diaphragm regulating mechanism 16 may be incorporated in the optical lens system 14 by setting the mechanical shutter 18 to be a lens shutter.

The mechanical shutter 18 has the function of shielding a light to be irradiated on the image pick-up section 12 only during photographing and determining an exposure time by the start and end of exposure. The mechanical shutter 18 has such a focal plane type as to be used in a single-lens reflex camera, for example. In this type, exposure is carried out by a slit formed the moment a shutter screen runs longitudinally or transversely. Moreover, the lens shutter type may be used as described above. The mechanical shutter 18 is opened or closed in response to a driving signal 30*c* supplied from the driver 30.

The image pick-up section 12 includes an optical low-pass filter 12*a*, a color filter 12*b* and a solid-state image pick-up device 12*c*. The optical low-pass filter 12*a* serves to set the spatial frequency of an incident light to be equal to or lower than a Nyquist frequency. The color filter 12*b* has a color filter segment for primaries RGB provided with a predetermined positional relationship one-on-one to each of photoreceptors (photosensitive cells) of the solid-state image pick-up device 12*c*. Accordingly, the color filter depends on the arrangement of the photoreceptor of the solid-state image pick-up device 12*c*.

The solid-state image pick-up device 12*c* includes a charge coupled device (CCD) and a metal oxide semiconductor (MOS). A driving signal 30*d* is also supplied from the driver 30 to the solid-state image pick-up device 12*c*. The driving signal 30*d* is supplied to the solid-state image pick-up device 12*c* according to an operation mode. In a static image photographing mode in the operation modes, the solid-state image pick-up device 12*c* reads a signal charge stored in the vertical transfer register 122 and is stored in a buffer memory, and then reads a signal charge generated by a photoelectric conversion from the photoreceptor 120 at time of an exposure onto the vertical transfer register through a gate, and shifts and horizontally transfers the signal charge transferred to a horizontal transfer register provided in an orthogonal direction to the register, that is, a horizontal direction.

In a dynamic image photographing mode, moreover, the solid-state image pick-up device 12*c* reads a signal charge generated by photoelectrically converting the exact signal charge of the vertical transfer register from the photoreceptor 120 at time of the exposure onto the vertical transfer register through the gate, and shifts and horizontally transfers the signal charge transferred to the horizontal transfer register provided in an orthogonal direction to the register, that is, a horizontal direction. In the vertical transfer, the solid-state image pick-up device 12*c* mixes the signal charges sent from pixels having the same color or carries out thinning reading in the vertical direction in consideration of a color array, thereby increasing the speed of signal reading. For example, in the case in which two horizontal transfer registers are provided, a line shift is carried out to mix the signal charges having the same color for a horizontal blanking period. In the G square RB perfect checker pattern, ¼ thinning is carried out for the vertical thinning to read the signal charge, for example.

The signal charge transferred horizontally is Q/V converted into a voltage signal by using a floating diffusion amplifier (FDA) for an output amplifier in any mode. The image pick-up section 12 outputs an analog signal 12*d* thus obtained by the Q/V conversion to the preprocessing section 20.

The preprocessing section 20 includes a correlated double sampling (CDS) circuit for noise removal, a gain control amplifier (GCA) and an A/D converter (an Analog-to-Digital converter). The preprocessing section 20 outputs, as digital data 20*a*, all image pick-up data obtained by carrying out noise removal, waveform shaping and digitization over the supplied analog signal 12*d* through a system bus 100 to the signal processing section 22.

The signal processing section 22 includes a signal generating circuit, a memory, a gamma correcting circuit, an evaluation value calculating section, a pixel interpolation processing circuit, a color difference matrix processing circuit, and a compression/expansion processing circuit which are not shown. A control signal 26*b* is supplied from the system control section 26 to the signal processing section 22. The signal generating circuit of the signal processing section 22 which is not shown is operated in response to the control signal 26*b*. The signal generating circuit has a PLL (Phase Locked Loop) circuit capable of generating a plurality of frequencies. The signal generating circuit multiplies, as a reference clock, an oscillation frequency generated from a source and thus generates plural kinds of clock signals 22*a* and outputs a clock signal 22*b* to the system control section 26 and the timing signal generating section 28 through the system bus 100.

On the other hand, a timing signal is supplied from the timing signal generating section 28 to the signal processing section 22, which is not shown. The timing signal includes a horizontal synchronization signal HD, a vertical synchronization signal VD and an operating clock of each section which will be described below.

The image data 20*a* are input to the memory through the system bus 100 and a data bus 22*c* for inputting/outputting a signal and are temporarily stored in the memory. Image data in the incidence hole 124, that is, the past virtual pixels are distinguished and treated as existing information in the static image photographing mode and are stored in the memory. Information sent from the incidence hole 124 is variably treated depending on the presence of the color filter segment on the incidence hole 124. When the color filter segment is not present, the acquired information is treated as high-pass luminance data $Y_H$. When the color filter segment is present, the acquired information is treated as pixel data having a color attribute.

Moreover, image data obtained from the signal charge which is ¼ thinned in a vertical direction without taking the incidence hole 124 into consideration are supplied to the memory in a dynamic image photographing mode in the same manner as in the normal case. The memory carries out thinning reading in a horizontal direction in order to increase an aspect ratio and a signal reading speed in the reading operation. Also in this case, image data are read so as not to break a color array pattern. The incidence hole 124 is formed in case of FIG. 1 in such a manner that an original color array pattern is maintained in the memory and the image data acquired through the vertical transfer register having no incidence hole 124 are read out even if the thinning in the horizontal direction is carried out. As a result, the image data are ⅓ thinned in the horizontal direction and are thus read out.

The memory supplies the stored image data to the gamma correcting circuit. Moreover, it is preferable that the memory should use a nonvolatile memory when carrying out repetitive reading. The gamma correcting circuit includes a look-up table for a gamma correction, for example. The gamma correcting circuit carries out the gamma correction over the image data supplied as one of preprocessings in an image processing by using the data of the table. The gamma correcting circuit supplies the image data subjected to the gamma correction to the evaluation value calculating section and the pixel interpolation processing circuit, respectively.

The evaluation value calculating section includes an arithmetic circuit for calculating a diaphragm stop and shutter speed, a white balance (which will be hereinafter referred to as WB) regulation value and a gradation correction value. The evaluation value calculating section calculates each proper parameter by an arithmetic processing based on the supplied image data in the circuit described above. The results of the calculation are supplied as a parameter 22*d* to the system control section 26 through the data bus 22*c* and the system bus 100.

The evaluation value calculating section is not always provided in the signal processing section 22 but may be provided in the system control section 26. In this case, the signal processing section 22 supplies the image data subjected to the gamma correction to the system control section 26.

The pixel interpolation processing circuit has the function of interpolating, generating and calculating pixel data. The image pick-up section 12 uses the color filter 12*b* formed of a single plate. Therefore, colors other than the real color of the color filter segment cannot be obtained from the image pick-up device. The pixel interpolation processing circuit generates, through an interpolation, pixel data having the color which cannot be obtained in the static image photographing mode. The pixel interpolation processing circuit supplies plain image data to the color difference matrix processing circuit.

The pixel interpolation processing circuit may have the function of increasing the band of the generated pixel data. In the case in which the solid-state image pick-up device 12*c* of a so-called honeycomb type is used for the image pick-up section 12, moreover, the pixel interpolation processing circuit generates pixel data on primaries RGB by an interpolation processing in a position in which a pixel is actually present (an actual pixel) and a position in which the pixel is not present (a virtual pixel) by using the image data subjected to the gamma correction.

Pixel data in the virtual pixel position corresponding to the incidence hole 124 are exactly used as real existing information. For example, in the case in which the pixel data are high-pass luminance data $Y_H$, the pixel interpolation processing circuit uses the high-pass luminance data $Y_H$ in place of luminance data generated by surrounding estimation. By using the information obtained actually, thus, it is possible to increase the precision of the pixel data in the virtual pixel position as compared with the luminance data obtained by the estimation. Referring to the pixel data having a color attribute, similarly, it is possible to increase precision of a data level as compared with an average level obtained by the estimation. Accordingly, it is possible to accurately express the edge of a generated image and a color boundary. This greatly contributes to an enhancement in a resolution and the effect of suppressing a false color.

The color difference matrix processing circuit generates luminance data Y and color data Cb and Cr by using image data supplied from the pixel interpolation processing circuit and a predetermined coefficient. The image data thus generated are supplied to the compression/expansion processing circuit.

The compression/expansion processing circuit carries out a compression processing over the image data (Y/C) supplied in the static image or dynamic image (movie) mode in standards of JPEG (Join Photographic coding Experts Group), MPEG (Moving Picture coding Experts Group)-1 and MPEG-2, respectively. The compression/expansion processing circuit sends the compressed image data to a storage 34 through the data bus 22c, the system bus 100 and a data bus 34a and records the same image data in the storage 34. The compression/expansion processing section supplies the image data recorded in the storage 34 through the data bus 34a, the system bus 100 and the data bus 22c and carries out an expansion processing. The expansion processing is reverse to the compression processing.

Moreover, the signal processing section 22 carries out an RGB conversion over the generated image data or the image data (Y/C) expanded with a reproduction, and supplies the image data 22c subjected to the RGB conversion to the monitor 32 through the system bus 100 and a data bus 32a. The image of the image data 22c supplied by a display controller (not shown) is displayed on the monitor 32 by an operation carried out through a display device.

In the case in which image data are to be input/output to/from an external apparatus, it is preferable that the signal processing section 22 should be provided with an external I/F circuit which is not shown. Examples of the external I/F circuit include a PIO (Programmed Input/Output), a UART (Universal Asynchronous Receiver/Transmitter: a transmitting/receiving circuit for an asynchronous serial communication), a USB (Universal Serial Bus), and an interface based on IEEE1394 standards (the Institute of Electrical and Electronics Engineers).

The PIO is an interface section capable of changing an input/output based on a program. The UART is a device to be used in a serial interface. The device has the function of converting a supplied parallel signal into a serial signal and converting a serial signal sent from a serial device into a parallel signal. The I/F based on the IEEE1394 standards supports a data transfer up to 400 Mbps, for example.

The operating section 24 includes a mode selecting section 24a and a release shutter button 24b. The mode selecting section 24a selects either a static image photographing mode or a dynamic image photographing mode. The mode selecting section 24a outputs a selected mode signal 24c to the system control section 26. The release shutter button 24b has a stroke in two stages and outputs, to the system control section 26, a trigger signal 24d for setting the digital camera 10 into a preliminary image pick-up stage (S1) in a stroke of a first stage and setting the digital camera 10 into a regular image pick-up stage (S2) in a stroke of a second stage. The operating section 24 may further be provided with a zoom selecting switch and a cross button and may have the function of selecting the condition to be displayed on a liquid crystal display panel.

The system control section 26 is a microcomputer or a CPU (Central Processing Unit) which serves to control a general purpose portion of a whole camera and a portion for carrying out a digital processing. The system control section 26 sets the digital camera 10 into the static image photographing mode or the dynamic image photographing mode in response to the supplied mode signal 24c. The system control section 26 generates a control signal 26a upon receipt of the setting mode signal 24c and the trigger signal 24d for giving a notice of an image pick-up timing from the release shutter button 24b. The control signal 26a thus generated is supplied as control signals 26b and 26c to the signal processing section 22 and the timing signal generating section 28 through the system bus 100, respectively.

The system control section 26 generates the control signal 26a in consideration of a line interpolation in the signal processing section 22, a control for the signal generating circuit and a control for the execution of a signal processing. Moreover, the system control section 26 also carries out a read/write control in the preprocessing section 20 and the storage 34, which is not shown.

The timing signal generating section 28 generates a timing signal in response to the control signal 26c supplied from the system control section 26 on the basis of the clock signal 22b supplied from the signal processing section 22. The timing signal includes a vertical synchronization signal, a horizontal synchronization signal, a field shift pulse, a vertical transfer signal and a horizontal transfer signal. The timing signal generating section 28 supplies these timing signals 28a thus generated to the driver 30, the preprocessing section 20, and the signal processing section 22 and the system control section 26 which are not shown in response to an operation, respectively.

The driver 30 has a driving circuit for generating driving signals 30a, 30b, 30c and 30d based on the timing signal 28a and the control signal 26c which are supplied. The driver 30 supplies the driving signals 30a and 30b to the optical lens system 14 and the diaphragm regulating mechanism 16 based on the control signal 26c to carry out an AF regulation and an AE regulation, respectively. The driver 30 outputs, to the mechanical shutter 18, the driving signal 30c for opening or closing the mechanical shutter 18 in response to a regular image pick-up timing supplied from the release shutter button 24b. Moreover, the driver 30 supplies, to the solid-state image pick-up device 12c, the driving signal 30d generated based on the timing signal 28a, stores a signal charge in each photoreceptor 120 for an exposure period and transfers the stored signal charge through a vertical transfer register and a horizontal transfer register.

The image data 22c are supplied from the signal processing section 22 to the monitor 32 through the system bus 100 and the data bus 32a. In general, a liquid crystal monitor is used for the monitor 32. The liquid crystal monitor is provided with a liquid crystal display controller. The liquid crystal display controller carries out a switching control by the arrangement of liquid crystal molecules and the application of a voltage based on the image data 22c. By the control, the liquid crystal monitor displays an image. It is apparent that the monitor 32 is not restricted to the liquid crystal monitor but a display apparatus having a small size and capable of confirming an image and suppressing power consumption can sufficiently be used.

The storage 34 records the image data supplied from the signal processing section 22 through the data bus 22c, the system bus 100 and the data bus 34a by using a recording medium such as a semiconductor memory. An optical disk or a magneto-optical disk may be used for the recording medium. The storage 34 writes/reads data by using a recording and reproducing head through suitable pick-up for each recording medium or a combination of the pick-up and a magnetic head. The data are written/read corresponding to the control of the system control section 26, which is not shown.

Figure 15:
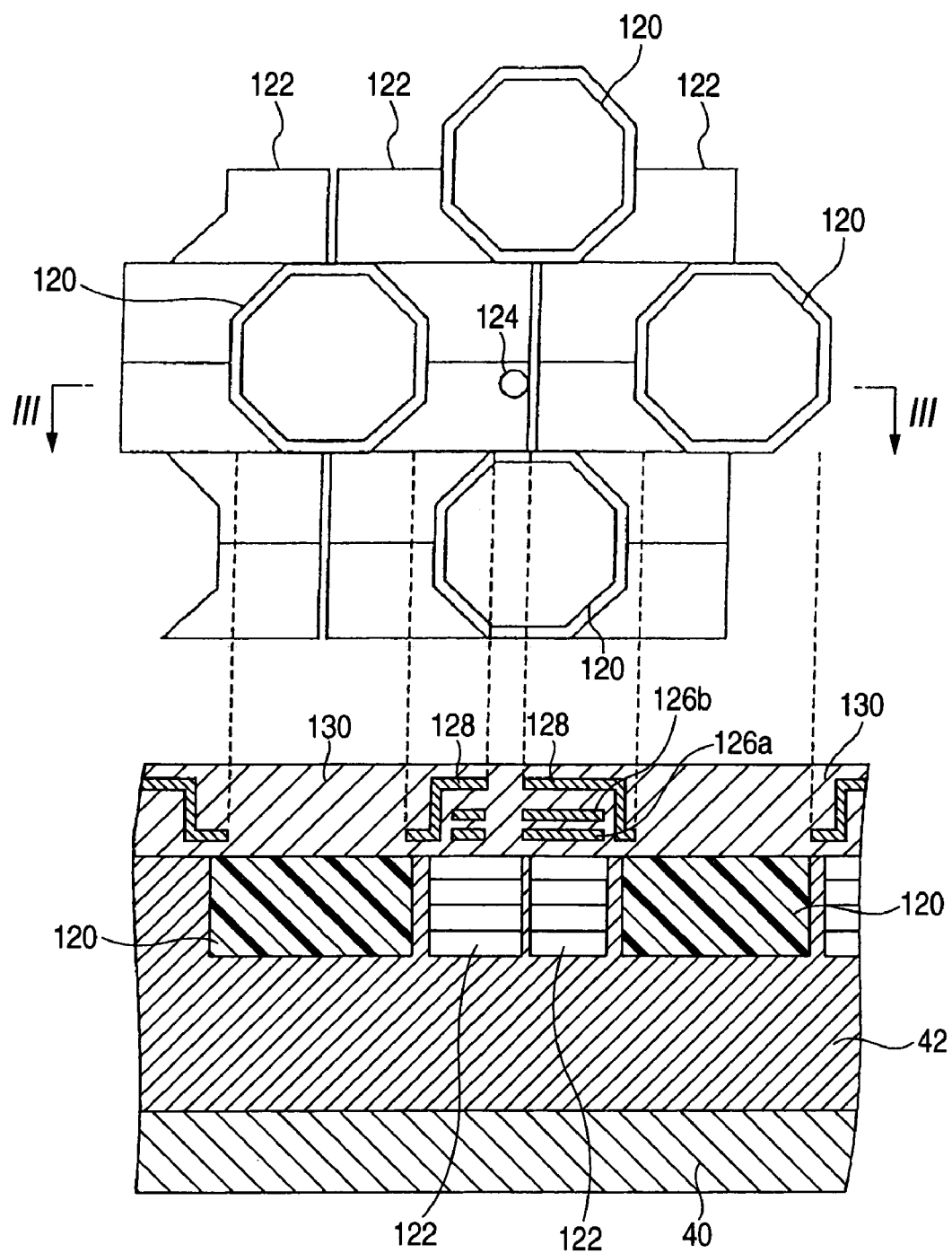
FIG. 15 is a front view showing the enlarged main part of the solid-state image pick-up device in FIG. 1 and a sectional view showing the solid-state image pick-up device taken along a cutting line III-III.

The solid-state image pick-up device 12c will be described again. The main part of the solid-state image pick-up device 12c is enlarged and the incidence hole 124 is formed on one of the sides of the vertical transfer register 122 as shown in FIG. 15. The incidence hole 124 is formed in the vertical transfer register 122 in the vicinity of an original virtual pixel as described above. There is illustrated a section obtained by taking away the solid-state image pick-up device 12c along a cutting line III-III. A p well 42 is formed on an n-type silicon wafer 40. The p well 42 is formed to divide the regions of the photoreceptor 120 and the vertical transfer register 122. An n layer (not shown) is formed as a photodiode in the region of the photoreceptor 120 thus divided and a p+ layer is formed thereon.

A p well is formed in a region of the vertical transfer register 122 which is not shown and an n layer is formed thereon. A gate is formed between each photoreceptor 120 and the vertical transfer register 122 provided on the right side of the photoreceptor 120, which is not shown. Each of the photoreceptor 120 and the vertical transfer register 122 has the two layers which are formed in the region respectively and is set to have the same level, for example. Layers are provided by using silicon dioxide ($SiO_2$) and resin to form two-layer polysilicon films 126a and 126b and a shielding film 128. The two-layer polysilicon films 126a and 126b are connected to each other through a metal electrode, which is not shown. The shielding film 128 shields a light by using a material such as tungsten or aluminum. The shielding film 128 is formed to cover the periphery of the photoreceptor 120 and to completely cover the vertical transfer register 122 region.

In the embodiment, the two-layer polysilicon films 126a and 126b and the shielding film 128 form a mask by using a resist in such a manner that a light is incident in the vertical transfer register 122. In a region in which the mask is formed, the resist of the mask corresponding to each of the films 126a, 126b and 128 is removed and $SiO_2$ (130) is provided as shown in a section so that the incidence hole 124 is formed. Furthermore, $SiO_2$ is provided and smoothened.

The color filter 12b and an on-chip microlens are formed on the $SiO_2$, which is not shown. When the color filter 12b forms a color filter segment to cover only the photoreceptor 120 region, a white light is incident on the incidence hole 124. In this case, a signal charge corresponding to a luminance signal is generated in the incidence hole 124. In the case in which the incidence hole 124 is covered with a color filter segment having one of the primaries RGB, moreover, a signal charge having the color attribute of the same color filter segment is generated. The incidence hole 124 formed in the vicinity of a position treated as a virtual pixel is thus utilized as a new information source in image formation. The information sent from the incidence hole 124 is utilized in the static image photographing mode.

Figure 16:
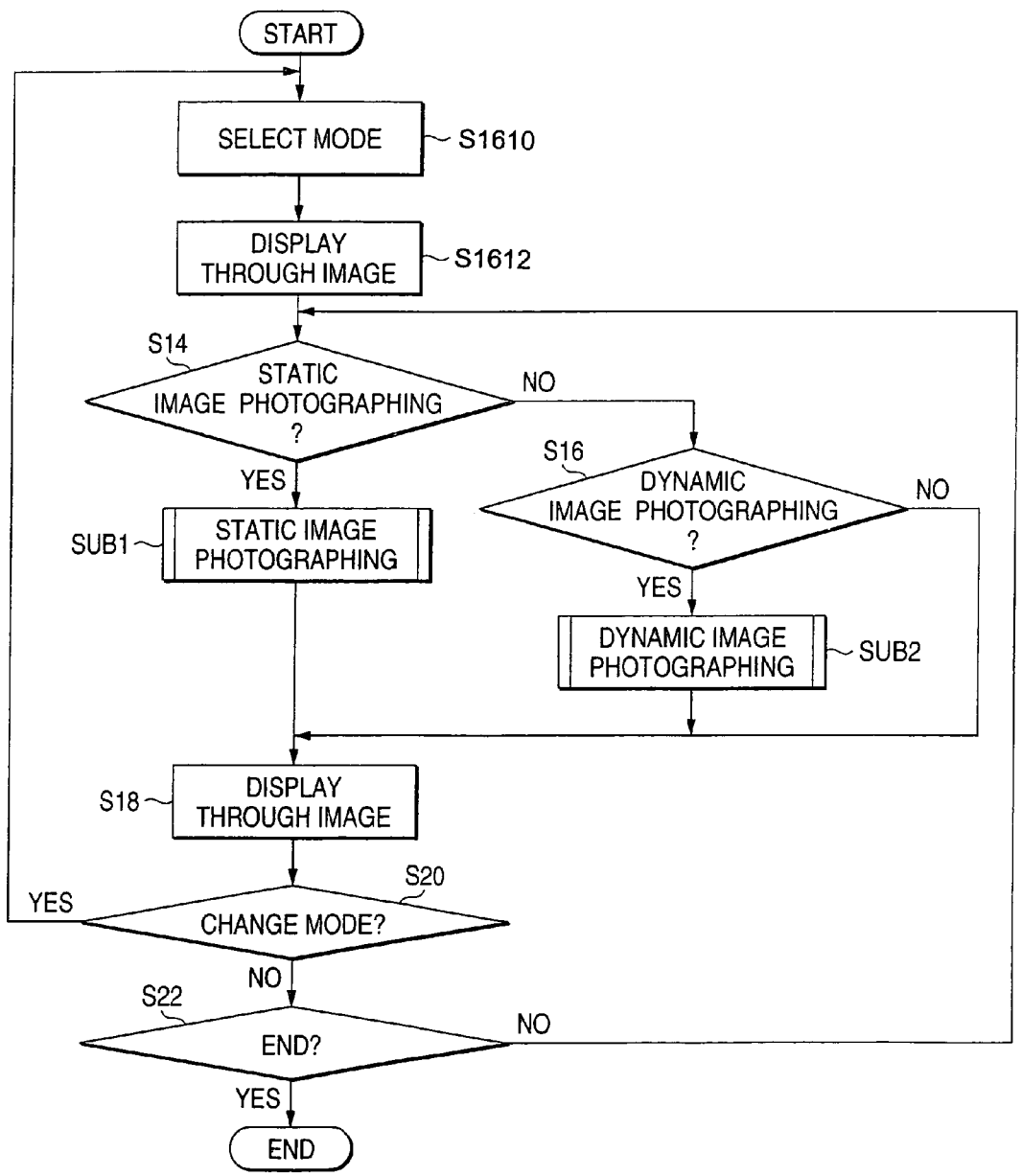
FIG. 16 is a main flowchart for explaining a photographing procedure in the digital camera of FIG. 2.

Next, the operation of the digital camera 10 will be described. FIG. 16 shows the main routine of the digital camera 10. After a power source is turned ON, initialization is carried out. Then, a photographing mode is selected (a step S1610). For the mode selection, either a static image photographing mode or a dynamic image photographing (movie) mode is selected by the mode selecting section 24a. A result of the selection is supplied as the mode signal 24c to the system control section 26. After the selection, the processing proceeds to through image display.

The through image display is an operation for displaying, on the monitor 32, image data obtained by supplying the image data 20a sent from the image pick-up section 12 to the signal processing section 22 and processing the same image data 20a (a step S1612). In order to carry out this operation, the timing signal generating section 28 and the driver 30 are controlled by the system control section 26. The AF regulation, the AE regulation and the mechanical shutter are brought into an opening state. The image pick-up section 12 photoelectrically converts an incident light in response to the timing signal 28a and ¼ thins a signal charge thus obtained in a vertical direction and then transfers the thinned signal charge, for example. The signal charge is changed into an analog signal through the FDA to be output to the preprocessing section 20.

The signal processing section 22 fetches, into the memory, the image data 20a converted by the preprocessing section 20. In this case, the image data 20a are thinned in a horizontal direction and are thus read as a dynamic image in the memory. The images thus thinned in the vertical and horizontal directions are supplied to the monitor 32. The processing proceeds to the decision of the operation (to a step S14) while carrying out the through image display.

Next, it is decided whether the digital camera 10 is set in the static image photographing mode or not (the step S14). In the system control section 26, the decision is carried out based on the result of the mode selection. If the static image photographing mode is selected (YES), the processing proceeds to static image photographing (a subroutine SUB1). Moreover, if the static image photographing mode is not selected (NO), the processing proceeds to a decision whether dynamic image photographing is selected or not (to a step S16).

This decision is carried out by the system control section 26 in the same manner as that in the case of the decision in the static image photographing. If the dynamic image photographing is selected (YES), the processing proceeds to the dynamic image photographing (a subroutine SUB2). Moreover, if the dynamic image photographing is not selected (NO), this state is maintained, that is, the processing proceeds to the through image display (to a step S18).

Also after the static image photographing (the subroutine SUB1) and the dynamic image photographing (the subroutine SUB2) are ended, the processing proceeds to the through image display (to the step S18). The digital camera 10 causes the monitor 32 to display the image of a field picked up by the image pick-up section 12 as described above.

When any of keys in the operating section 24 is manipulated, it is decided whether or not the key corresponds to the mode selecting section 24a in the system control section 26 (a step S20). If the key corresponds to the mode selecting section 24a (YES), it is decided that a mode change is set and the processing returns to the mode selection processing (to the step S1610). If the key does not correspond to the mode selecting section 24a or the key operation is not carried out for a predetermined time (NO), moreover, the processing proceeds to a decision whether the operation of the digital camera 10 is ended or not (to a step S22).

Subsequently, the decision of the end is carried out (the step S22). If the decision is not ended (NO), the previous photographing mode is held as mode information and the processing returns to the decision of the static image photographing, and this processing is repeated (to the step S14). When any key operation in the digital camera 10 is not carried out over a standby time, the through image display may be stopped in the photographing mode to automatically move into a standby mode. If the decision is ended (YES), moreover, the power supply is turned ON to end the operation of the digital camera 10. The result is supplied to the driver 30.

Figure 17:
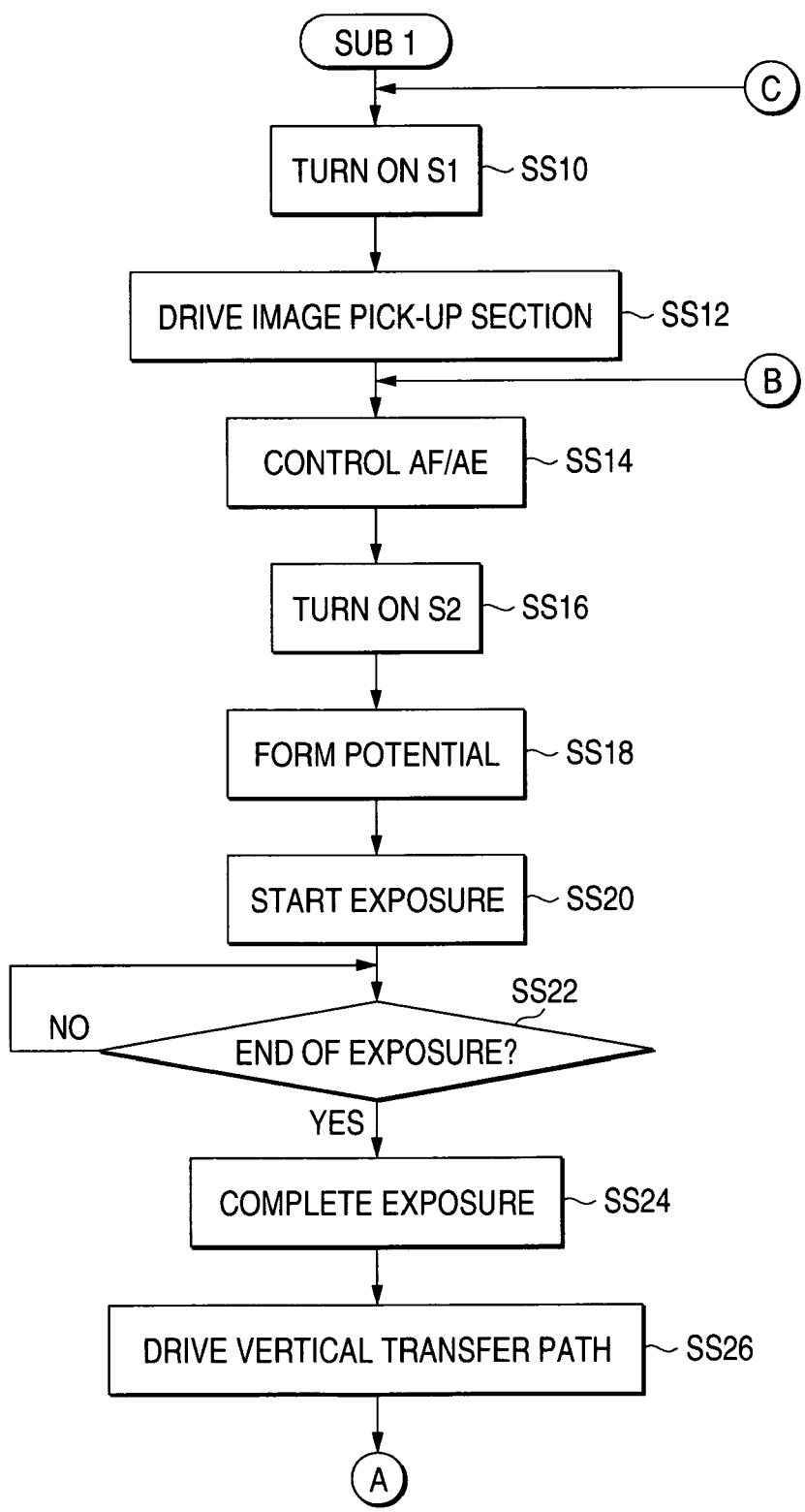
FIG. 17 is a flowchart for explaining an operation procedure in a static image photographing mode shown in FIG. 16.

Next, description will be given to the operation of the digital camera 10 in the static image photographing mode (the subroutine SUB1: see FIG. 17). The release shutter button 24b is operated in a half stroke (or up to a first stage) (S1: ON; a substep SS10). Then, the system control section 26 newly drives the image pick-up section 12 upon receipt of the trigger signal 24d corresponding to the operation (a substep SS12). The driving operation of the image pick-up section 12 is carried out in response to the driving signal 30d supplied from the driver 30 corresponding to the control of the system control section 26 in the same manner as in case of the through image.

The AF/AE control is carried out based on the image data 20a obtained by the driving operation of the image pick-up section 12 (a substep SS14). The signal processing section 22 generates a parameter for the AF regulation and the AE regulation in the evaluation value calculating section by using the supplied image data 20a. The signal processing section 22 supplies a parameter 22d to the system control section 26 through the data bus 22c and the system bus 100. The system control section 26 generates the control signal 26a corresponding to the parameter 22d and supplies the control signal 26c to the timing signal generating section 28 and the driver 30 through the system bus 100, respectively. The driver 30 generates the driving signals 30a and 30b for the AF/AE regulation in consideration of the control signal 26c and the timing signal 28a and supplies the same driving signals 30a and 30b to the optical lens system 14 and the diaphragm regulating mechanism 16, respectively.

The AF/AE control may be carried out based on information obtained by using a sensor prepared separately for the AF/AE regulation. Moreover, it is apparent that the operation at S1 is not restricted to a one-time operation but the above-mentioned processing is repeated when the operation of S1 is carried out until regular image pick-up is started, which is not shown.

The release shutter button 24b is operated in a full stroke (or up to two stages) (S2: ON; a substep SS16). Next, the system control section 26 controls to carry out the regular image pick-up for the image pick-up section 12 upon receipt of the trigger signal 24d corresponding to this operation (a substep SS18). For the control, the mechanical shutter 18 is closed in response to the driving signal 30c supplied from the driver 30 corresponding to the control of the system control section 26 and the signal charge stored in the vertical transfer register 122 is thus swept away. Then, the driver 30 supplies the driving signal 30d to form a potential in the vertical transfer register 122.

Thereafter, the mechanical shutter 18 is opened in response to the driving signal 30c supplied from the driver 30 (the start of an exposure: a substep SS20). The system control section 26 also controls an exposure time based on the supplied parameter 22d. At a substep SS22, whether the exposure time has passed is decided in the system control section 26. If the passage of the exposure time is not completed (NO), the decision is repeated. Moreover, if it is decided that the exposure time has passed (YES), the processing proceeds to an exposure completion processing (to a substep SS24).

Figure 18:
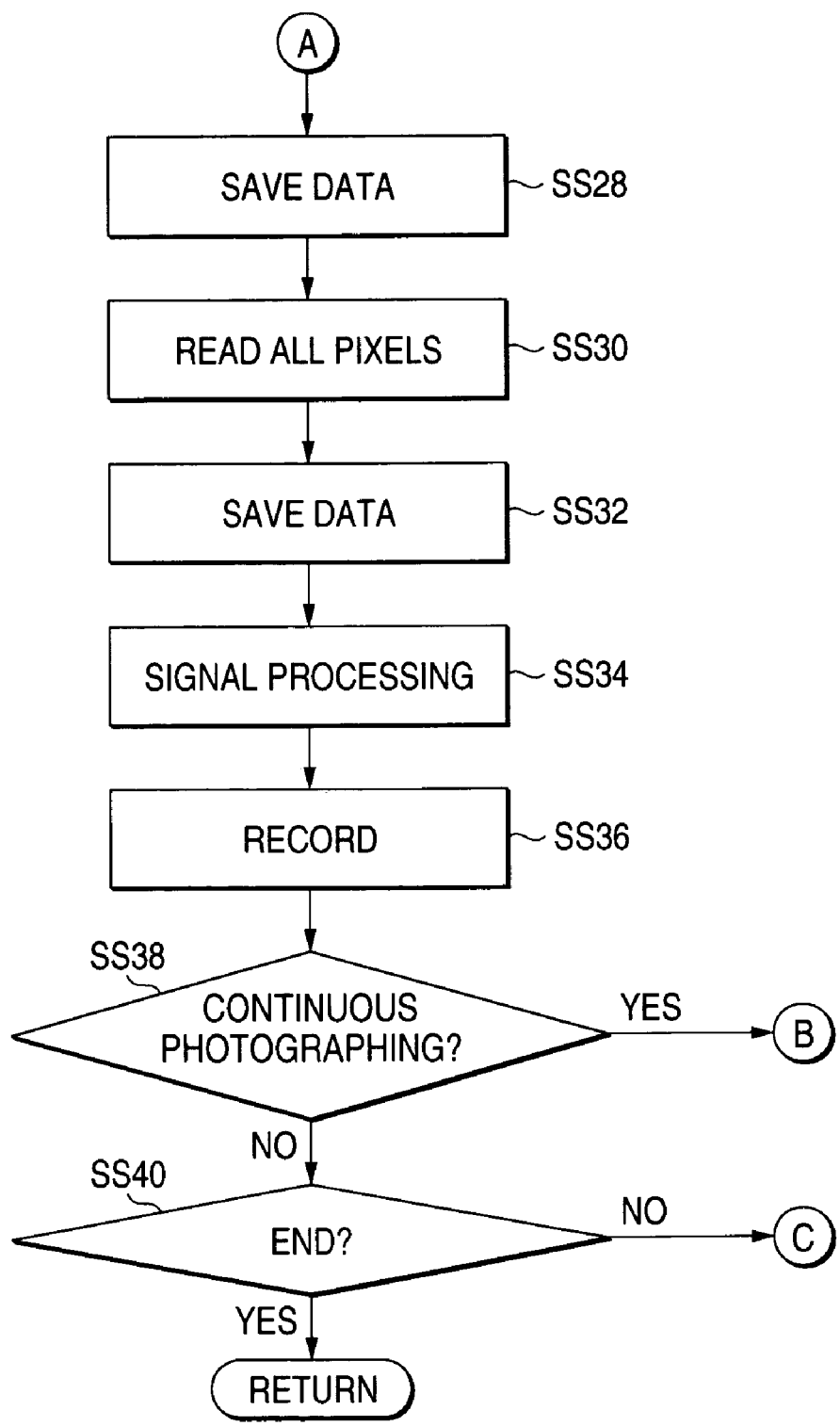
FIG. 18 is a flowchart for explaining the rest of the operation procedure in FIG. 17, FIGS. 19(*a*) to 19(*d*) show the diagrams showing the comparison of images obtained by photographing an object in the procedures of FIGS. 5 and 6 and the past procedures.

In the exposure completion processing, the driver 30 is controlled by the system control section 26 to supply the driving signal 30c to the mechanical shutter 18 so that the mechanical shutter 18 is closed (a substep SS24). Consequently, the image pick-up section 12 is brought into a shielding state. First of all, the image pick-up section 12 reads a signal charge which is photoelectrically converted corresponding to an amount of a light incident through the incidence hole 124 in this state and is stored in the vertical transfer register 122 (the driving operation of a vertical transfer path: a substep SS26). The signal charge is horizontally transferred and is converted into an analog voltage signal to be supplied to the preprocessing section 20. In the preprocessing section 20, the analog voltage signal is converted into a digital signal. The preprocessing section 20 outputs the image data 20a to the memory of the signal processing section 22. A processing in FIG. 18 is started through a connecting part A (to a substep SS28).

Next, the memory saves data transferred from the position of the virtual pixel which cannot be directly obtained (a substep SS28). After the data are saved, a signal charge is read from the photoreceptor 120 to the vertical transfer register 122 and all the pixels are thus read as usual (a substep SS30). The transfer of a signal charge, a Q/V conversion for the signal charge and a digital conversion for an analog signal are sequentially carried out so that the image data 20a corresponding to the photoreceptor 120 are saved in the memory of the signal processing section 22 (a substep SS32).

Subsequently, a signal processing is carried out by using the image data 20a thus saved (a substep SS34). In the signal processing section 22, a gamma correction, a pixel interpolation processing, a matrix processing and a compression processing are sequentially carried out for the image data 20a. In particular, the image data 20a obtained from the incidence hole 124 in the image interpolation processing are used as luminance data $Y_H$ in a virtual pixel position. The luminance data $Y_H$ obtained actually can be used with higher level precision than the luminance data $Y_H$ calculated by adding and averaging surrounding pixel data.

The image data obtained after the compression processing are supplied to and recorded in the storage 34 through the data bus 22c, the system bus 100 and the data bus 34a (a substep SS36). At almost the same time, in the signal processing section 22, the image data thinned from the image data obtained before the compression may be supplied to and displayed on the monitor 32.

Next, it is decided whether the digital camera 10 receives an instruction for continuous photographing or not (a substep SS38). More specifically, it is decided whether or not the release shutter button 24b is continuously pushed into the stroke state in the S2. If the continuous photographing is to be carried out (YES), the processing returns to the AF/AE control shown in FIG. 17 through a connecting part B, for example (to the substep SS14) and each of the processings is repeated. If single photograping is to be carried out (NO), the processing proceeds to a decision whether the static image photographing mode is ended or not (to a substep SS40).

While the decision of the presence of the continuous photographing is carried out after the completion of the recording for convenience, a next exposure may be started if data are completely read from the image pick-up section 12.

It is decided whether the operation in the static image photographing mode is ended or not (a substep SS40). If the static image photographing mode is continuously set (NO), the processing returns to the substep SS10 to be the first processing shown in FIG. 17 through a connecting part C and the past processings are repeated. Moreover, if the static image photographing mode is ended (YES), the processing moves to a return and the subroutine SUB1 is thus ended.

By such an operation, actual data are obtained in the vicinity of the virtual pixel. Therefore, a correlated decision processing is carried out by using the surrounding pixel data. If the correlation is present, estimation is carried out based on the addition and average of pixel data in a correlating direction. Consequently, it is possible to acquire information with higher level precision than that of the data of a virtual pixel to be calculated.

This relationship will be briefly described with reference to FIGS. 19(a) to 19(d). There is an object 44 shown in FIG. 19(a). The object 44 is divided into a black region 44a shown in cross hatching and a white region 44b through a stepped obliquely and rightward upward boundary 44c. When the object 44 is photographed in a static image by means of the digital camera 10 according to the embodiment, the object 44, the photoreceptor 120 and the incidence hole 124 in the solid-state image pick-up device 12c have a relationship shown in FIG. 19(b). The photoreceptor (actual pixel) 120 is represented by a great circle shown in a solid line, the incidence hole 124 is represented by a small circle shown in a solid line, and the virtual pixel is represented by a small circle shown in a broken line.

Figure 19:
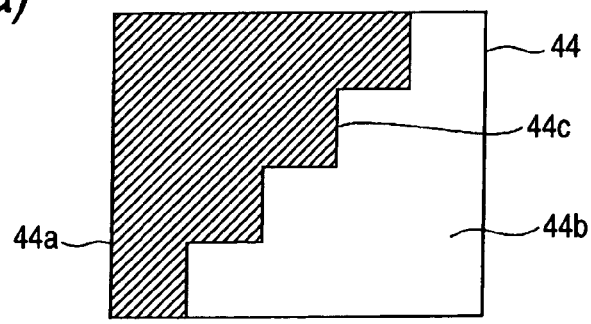
Figure 19:
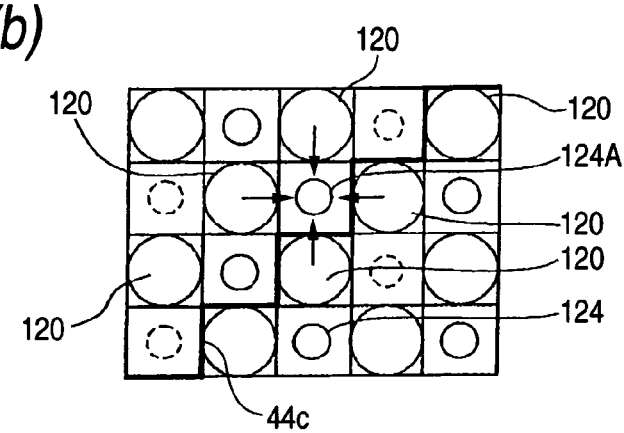
Figure 19:
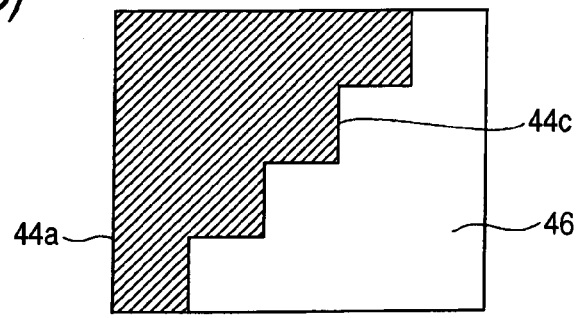
Figure 19:
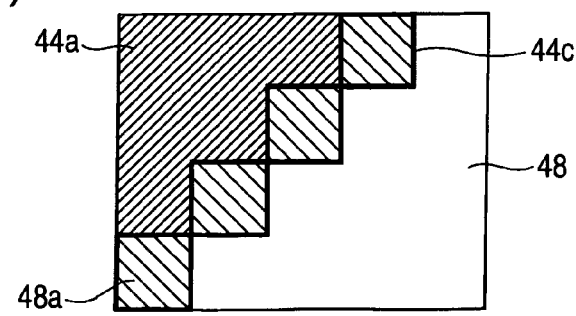
Figure 20:
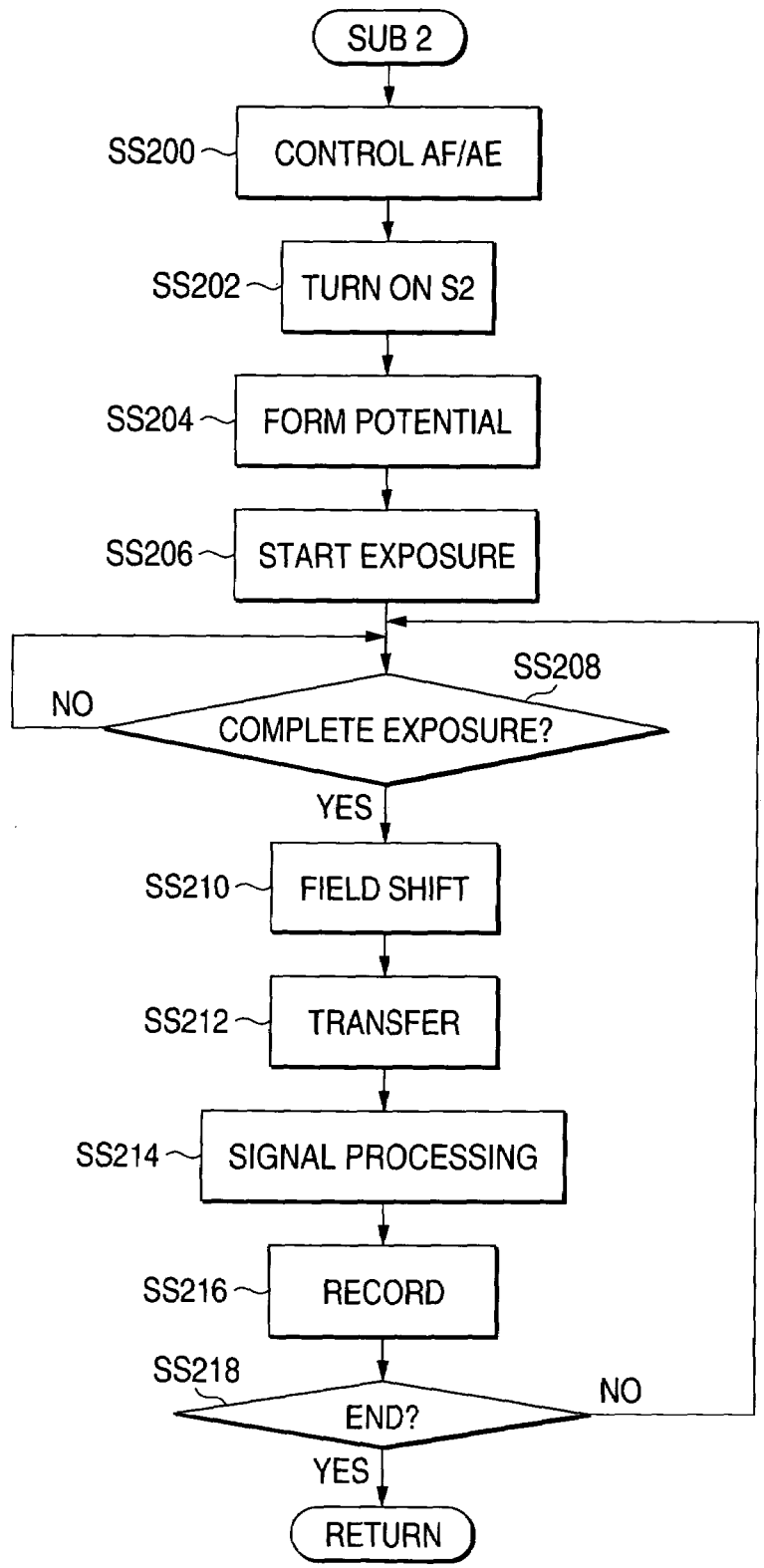
FIG. 20 is a flowchart for explaining an operation procedure in a dynamic image photographing mode shown in FIG. 16.

By the static image photographing, for example, the incidence hole 124 in the black region 44a is set to have a level of 0 and the incidence hole 124 in the white region 44b is set to have a level of 1. At this time, an incidence hole 124A in the boundary 44c is set to have the level of 0. The incidence hole 124 which is provided obliquely and leftward downward is also set to have the level of 0. When a virtual pixel positioned in the vicinity of the boundary 44c has an estimation level of 0.3 by averaging using pixel data transferred from two obliquely adjacent photoreceptors (actual pixels) 120 through the boundary 44c and the actual data of the incidence hole 124A. When the level of the virtual pixel is calculated by utilizing this relationship, a virtual pixel provided leftward and obliquely downward also has the level of 0.3 and a value close to black is obtained. As a result, an image 46 shown in FIG. 19(c) is obtained. The image 46 reproduces the object 44 almost faithfully.

On the other hand, when a virtual pixel level corresponding to the incidence hole 124A is first calculated by using the past correlated decision processing, it is apparent that there is no correlation in horizontal and vertical directions. At this time, the level of the virtual pixel is calculated by averaging four surrounding actual pixels. The result of estimated calculation for the virtual pixel level is 0.5. In case of monochrome, a virtual pixel level of 0.5 corresponds to gray. As a result, an image 48 shown in FIG. 19(d) is obtained. In the image 48, a gray region 48a shown in hatching is formed in the vicinity of the boundary 44c corresponding to the position of the virtual pixel. The formation of the gray region 48a brings an image having filling so that the resolution of the image is deteriorated.

Even if an image has an oblique boundary such as a highlight white void, it is possible to represent an accurate contour without forming the gray region. Also in a color expression with a color image, it is possible to decrease the false signal of a color by utilizing the incidence hole 124. Thus, a color resolution can be enhanced.

Next, description will be given to the operation of the digital camera 10 in the dynamic image photographing mode (see FIG. 8). The dynamic image photographing has already been carried out in the state of through image display described above. For this reason, when the processing is moved to the dynamic image photographing mode in the subroutine SUB2, the AF/AE control is first carried out (a substep SS200). The release shutter button 24b is pressed corresponding to a full stroke in a timing desired by a user (the state of S2: a substep SS202).

The system control section 26 controls to carry out the regular image pick-up for a dynamic image for the image pick-up section 12 upon receipt of the trigger signal 24d corresponding to the operation (a substep SS204). For this control, the mechanical shutter 18 is maintained to be set in an opening state in response to the driving signal 30c supplied from the driver 30 corresponding to the control of the system control section 26 and the signal charges stored in the vertical transfer register 122 are continuously swept away immediately before an exposure is started. Then, the driver 30 supplies the driving signal 30d to form a potential in the vertical transfer register 122.

Thereafter, an electronic shutter is turned OFF in response to the driving signal 30c supplied from the driver 30, thereby starting the exposure (a substep SS206). The system control section 26 also controls an exposure time from the supplied parameter 22d. It is decided whether the exposure time has passed or not in the system control section 26 (a substep SS208). If the passage of the exposure time is not completed (NO), the decision is repeated. Moreover, if it is decided that the exposure time has passed (YES), the processing proceeds to an exposure completion processing (to a substep SS210).

In the exposure completion processing, the driver 30 is controlled from the system control section 26 to supply the driving signal 30d to the image pick-up section 12, and the signal charge is field shifted to the vertical transfer register 122 (the substep SS210). The image pick-up section 12 sweeps the signal charge away also immediately before the exposure before the field shift is carried out. The processing of sweeping the signal charge from the vertical transfer register 122 is carried out again in this stage in order to make sure. The reason is that there is a possibility that an overflow might be caused when the signal charge is read from the adjacent photoreceptor 120 to the vertical transfer register 122 together with the signal charge which is photoelectrically converted and stored corresponding to the amount of a light incident through the incidence hole 124 in this state.

The signal charge read onto the vertical transfer register 122 is ¼ thinned toward a horizontal transfer register (not shown) to carry out vertical mixing (a substep SS212). Furthermore, the signal charge is line shifted for a horizontal blanking period and is moved to the horizontal transfer register. The signal charge is horizontally transferred in the horizontal transfer register and is converted into an analog voltage signal to be supplied to the preprocessing section 20. In the preprocessing section 20, the analog voltage signal is converted into a digital signal. The preprocessing section 20 outputs the image data 20a to the memory of the signal processing section 22. Then, the image data 20a corresponding to the photoreceptor 120 are saved in the memory of the signal processing section 22.

Next, a signal processing is carried out by using the saved image data 20a (a substep SS214). First of all, the signal processing section 22 reads only any of the image data 20a which are stored in the memory and are supplied from the completely shielded vertical transfer register 122. More specifically, a horizontal thinning processing is carried out. Information sent from the other vertical transfer registers 122 having the incidence holes 124 formed therein are discarded. The vertical transfer register 122 having the incidence hole 124 formed therein suffers an incident light also during a transfer in addition to the read signal charge and is thus influenced by a smear.

In the case in which the solid-state image pick-up device 12c shown in FIG. 13 is used, the image data 20a are ⅓ thinned and read in a horizontal direction. In the signal processing section 22, a gamma correction, an image interpolation processing, a matrix processing and a compression processing are sequentially carried out for the image data 20a. The pixel interpolation processing is carried out in just the same procedure as before differently from the case of the static image photographing mode. Moreover, the compression processing is carried out according to the standards of MPEG-1 and MPEG-2.

The image data obtained after the compression processing are supplied to and recorded in the storage 34 through the data bus 22c, the system bus 100 and the data bus 34a (a substep SS216). At almost the same time, in the signal processing section 22, the image data thinned horizontally from the image data obtained before the compression may be supplied to and displayed on the monitor 32.

Next, it is decided whether the dynamic image photographing mode is ended or not (a substep SS218). If the release shutter button 24b is pressed corresponding to a full stroke again or a recording capacity is gone (YES), the system control section 26 outputs the control signal 26a upon receipt of the trigger signal 24d or according to the result of the detection of a capacity in the system control section 26. At this time, dynamic image recording in the storage 34 is ended and the through image display is preferably carried out continuously. The processing moves to a return according to the decision of the end and the subroutine 532 is thus ended. Moreover, if the dynamic image recording is continuously carried out (NO), the processing returns to the decision whether the exposure is completed or not (the substep SS208) and the processings described above are repeated.

Thus, all of the vertical transfer registers 122 are not provided with the incidence hole 124 but there is provided the vertical transfer register 122 which is shielded in such a manner that the color of the image data 20a obtained when horizontally thinning the color array pattern of the color filter 12b has the color array pattern of the color filter 12b in the signal processing section 22. Consequently, the dynamic image photographing can also be implemented.

Figure 21:
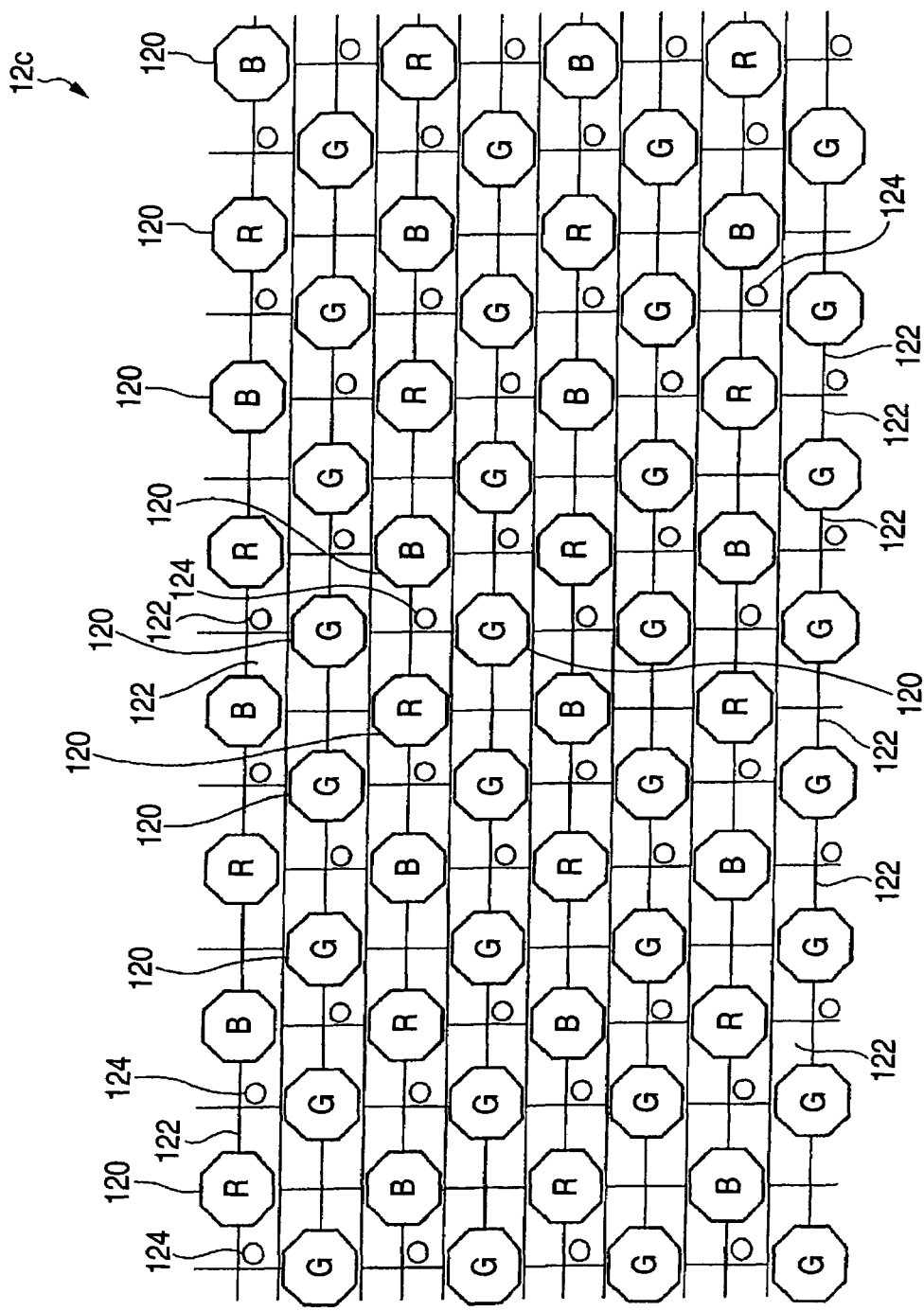
FIG. 21 is an explanatory view showing such a relationship that the formation position of the incidence hole is varied in the solid-state image pick-up device in FIG. 13.

While the incidence hole 124 in the solid-state image pick-up device 12c is provided in the left one of the vertical transfer registers 122 making a set of two lines in the example described above, the incidence hole 124 may be provided in the right vertical transfer register 122 (see FIG. 21). Since the vertical transfer register 122 which is completely shielded every three lines is provided, ⅓ thinning can be carried out in the horizontal direction by the signal processing section 22.

Figure 22:
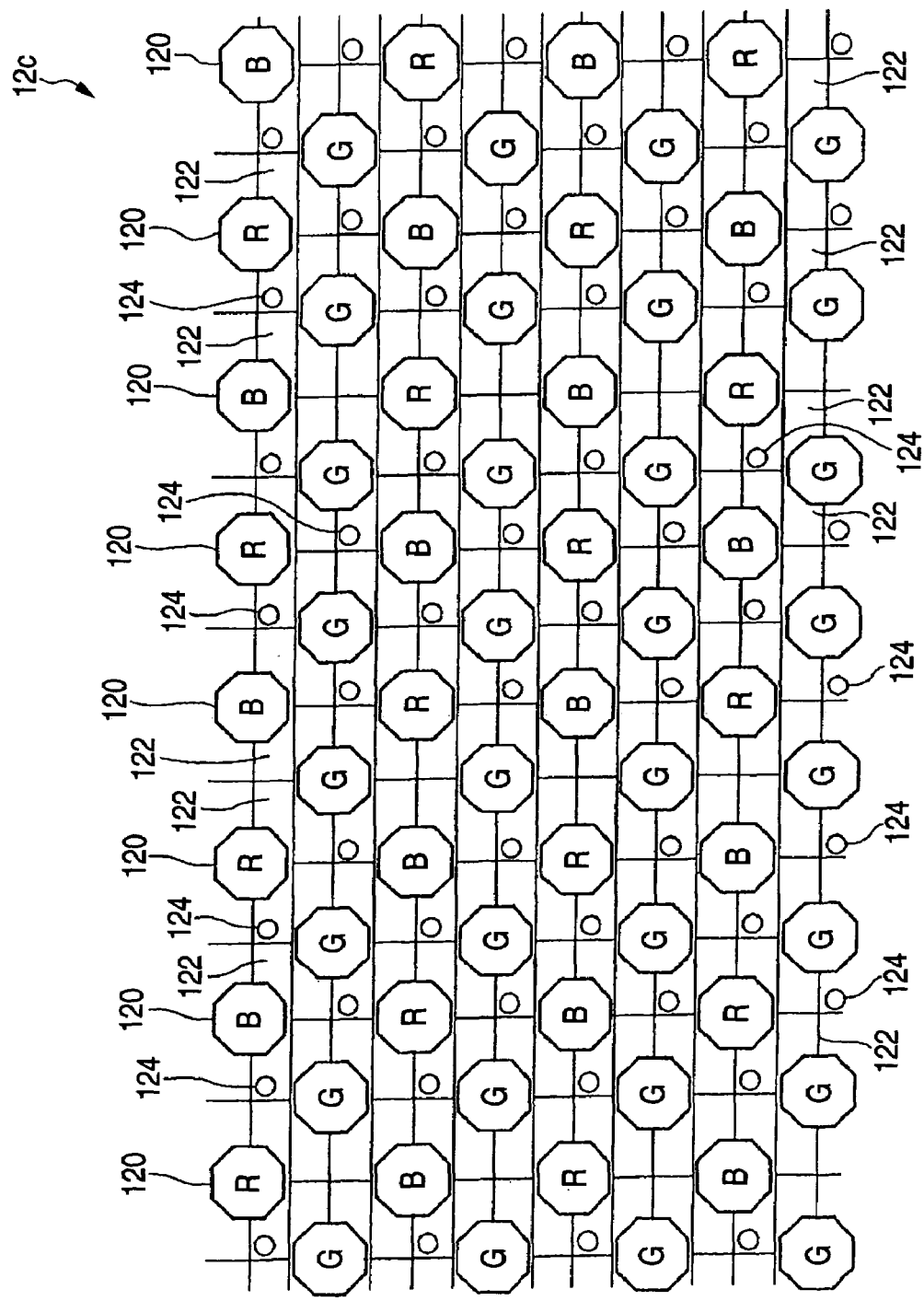
FIG. 22 is an explanatory view showing the relationship of the formation position of the incidence hole in which ⅕ thinning is carried out in the solid-state image pick-up device in FIG. 13.
Figure 23:
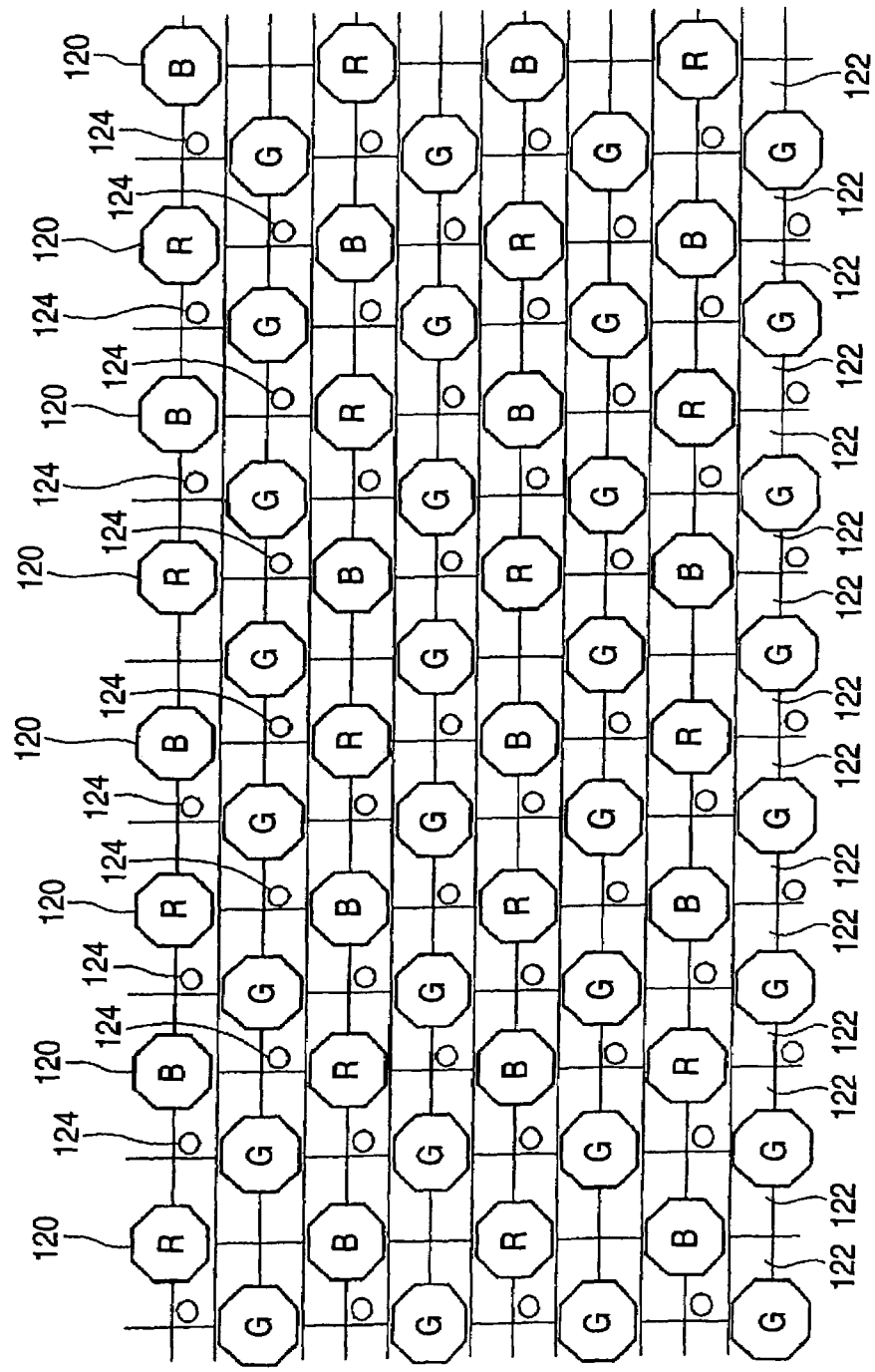
FIG. 23 is an explanatory view showing the relationship of the formation position of the incidence hole in which ⅐ thinning is carried out in the solid-state image pick-up device in FIG. 13.

Moreover, when the color filter 12b uses the G square RB perfect checker pattern, it is possible to carry out ⅕ thinning or ⅐ thinning in the horizontal direction in consideration of the position of the vertical transfer register 122 to be utilized in a dynamic image as shown in FIGS. 22 and 23. In the static image photographing, more incidence holes 124 are better. It is preferable that the thinning in the horizontal direction should be set in consideration of a balance with the number of pixels to be utilized in a dynamic image. In the G square RB perfect checker pattern, the horizontal thinning is carried out with 1/x (x is an odd number) depending on the pattern.

Moreover, the horizontal thinning is not restricted to the even horizontal thinning as described above but the incidence hole 124 of the solid-state image pick-up device 12c may be formed to carry out uneven horizontal thinning.

By the structure described above, the digital camera 10 carries out an exposure by utilizing the mechanical shutter 18, first reads data sent from the incidence hole as the actual data of a virtual pixel in the static image photographing mode, then reads a signal charge from the photoreceptor 120 onto the vertical transfer register 122 in a shielding state, and for example, sets the actual data as luminance data $Y_H$ and carries out an interpolation by using an actual pixel and the actual data in the signal processing section 22, thereby generating an image. Consequently, the precision of image data can be more enhanced than that of image data based on the estimation of the virtual pixel. Thus, image display can be carried out accurately. In particular, a contour in an oblique direction can be reproduced faithfully and the false signal of a color can be decreased to enhance a color resolution.

In the digital camera 10, moreover, the signal processing section 22 thins and reads, in a dynamic image photographing mode, only a signal read from the vertical transfer register 122 which has no incidence hole and is shielded. Consequently, it is possible to obtain a dynamic image without the influence of a smear. Thus, both the static image photographing mode and the dynamic image photographing mode can be implemented by one solid-state image pick-up device.

Furthermore, the solid-state image pick-up device 12c is provided with the adjacent photoreceptor 120 to the photoreceptor 120 shifted by an almost half pitch pixel and a set of vertical transfer registers 122 and 122 in two lines are consequently formed to meander between the photoreceptors 120 in a row direction, the vertical transfer register 122 which is shielded and the vertical transfer register 122 having the incidence hole 124 formed therein are regularly provided, and the vertical transfer register 122 which is shielded is provided in such a manner that the image data obtained by the horizontal thinning maintain the same relationship with the color array pattern of the color filter segments R, G and B covering the photoreceptor 120 which is adjacent to the vertical transfer register 122 by aiming at the same color array pattern. Consequently, it is possible to implement both the static image photographing mode and the dynamic image photographing mode by one solid-state image pick-up device.

According to the invention, imaginary pixel point data corresponding to the amount of a received light on an imaginary pixel point can be obtained separately from image data. Therefore, it is possible to correct the image data by using the imaginary pixel point data, thereby creating an image with a high resolution and high precision.

Further, a static image having a high finesses and picture quality can be picked up, a smear can be reduced also when a dynamic image is picked up.

Still further, the shielding means is utilized to carry out an exposure, data sent from an opening are first read as the actual data of a virtual pixel in static image photographing, a signal charge is then read from the photoreceptor onto the vertical transfer means in a shielding state and the same actual data are set to be luminance data, for example, and an interpolation is carried out by using an actual pixel and the actual data through the signal processing means to generate an image. Consequently, the precision of the image data can be more enhanced than that of image data based on the estimation of the virtual pixel. As a result, image display can be carried out accurately. In the dynamic image photographing, thus, the signal processing means horizontally thins and reads only the signal read from the shielded vertical transfer means having no opening. Consequently, it is possible to obtain a dynamic image without the influence of a smear.

According to the solid-state image pick-up device in accordance with the invention, moreover, signal reading in the dynamic image photographing is carried out and actual data obtained from a signal charge supplied from an opening positioned in the vicinity of a virtual pixel in addition to the signal charge supplied from the photoreceptor provide information having higher precision than that of the estimation data of the virtual pixel which are generated by the interpolation, while vertical thinning is carried out to read and transfer the signal charge, thereby performing the signal reading in the dynamic image photographing. In the signal reading in the dynamic image photographing, it is possible to obtain normal data maintaining a color array pattern for the dynamic image photographing by using only the data corresponding to any of the read signal charges which is obtained from the first vertical transfer means. In the solid-state image pick-up device, it is possible to implement both the static image photographing mode and the dynamic image photographing mode by one solid-state image pick-up device.

The invention claimed is:

1. A solid-state image pick-up device comprising:
   photoelectric converting devices formed at first array intervals in row and column directions on a semiconductor substrate;
   vertical transfer paths provided in the column direction and serving to read and transfer signal charges obtained by the photoelectric converting devices; and
   a shielding film that covers an upper part of the vertical transfer paths, wherein:
   a plurality of shieldless apertures are formed in each of a plurality of said vertical transfer paths and in positions corresponding to imaginary pixel point positions in the shielding film; and
   the shieldless apertures are arranged at second array intervals in the row and column directions.

2. The solid-state image pick-up device according to claim 1, wherein the photoelectric converting devices are arranged in the row direction with a shift of a ½ pitch alternately.

3. A digital still camera comprising:
   the solid-state image pick-up device according to claim 1 or 2;
   a mechanical shutter provided in a front part of the solid-state image pick-up device; and
   an image processing device for reading imaginary pixel point charges stored in the imaginary pixel point positions on the vertical transfer paths from the solid-state image pick-up device after the mechanical shutter is closed and then reading a signal charges of the photoelectric converting devices from the solid-state image pick-up device, thereby generating image pick-up data from the signal charges and the imaginary pixel point charges.

4. The solid-state image pick-up device according to claim 1, wherein each photoelectric converting device is disposed between a pair of the shieldless apertures that are adjacent to each other in the column direction and between a pair of the shieldless apertures that are adjacent to each other in the row direction.

5. The solid-state image pick-up device according to claim 1, wherein each shieldless aperture is formed above a channel stop between the adjacent vertical transfer paths.

6. A solid-state image pick-up device comprising:
   photoelectric converting devices formed at first array intervals in row and column directions on a semiconductor substrate;
   vertical transfer paths provided in the column direction and serving to read and transfer signal charges obtained by the photoelectric converting devices;
   a shielding film that covers an upper part of the vertical transfer paths; wherein a plurality of shieldless apertures are formed in each of a plurality of said vertical transfer paths and in positions corresponding to imaginary pixel point positions in the shielding film, and the shieldless apertures are arranged at secondary array intervals in the row and column directions; and
   a storage section that stores electric charges transferred along the vertical transfer paths by a predetermined number of lines, the storage section that transfers the electric charges to a horizontal transfer path, the storage section provided in a connecting portion between the vertical transfer paths and the horizontal transfer path.

7. The solid-state image pick-up device according to claim 6, wherein the photoelectric converting devices are arranged in the row direction with a shift of a ½ pitch alternately.

8. A digital still camera comprising:
   the solid-state image pick-up device according to claim 6 or 7;
   a mechanical shutter provided in a front part of the solid-state image pick-up device; and
   a controller that drives the vertical transfer paths at a higher speed than a transfer speed of a static image to fetch, to the storage section, only signal charges of a valid line constituting a dynamic image when photographing the dynamic image with the mechanical shutter opened.

9. The solid-state image pick-up device according to claim 6, wherein each photoelectric converting device is disposed between a pair of the shieldless apertures that are adjacent to each other in the column direction and between a pair of the shieldless apertures that are adjacent to each other in the row direction.

10. The solid-state image pick-up device according to claim 6, wherein each shieldless aperture is formed above a channel stop between the adjacent vertical transfer paths.

11. A solid-state image pick-up device comprising:
   photoreceptors provided in a two-dimensional array and serving to convert incident light into signal charges;
   a plurality of vertical transfer paths that transfers the signal charges converted by the photoreceptors in a vertical direction; and
   a horizontal transfer path that transfers the signal charges transferred in a horizontal direction which is orthogonal to the vertical direction, wherein:
   an interval between the photoreceptors provided in the vertical and horizontal directions is set to be a pitch,
   the photoreceptors which are adjacent to each other are provided with a shift of an almost half pitch,
   the vertical transfer paths are formed to make pairs of two lines between the photoreceptors provided in the horizontal direction,
   the vertical transfer paths are caused to make a detour every line for the photoreceptors which are adjacent to each other,
   the photoreceptors that are actually provided are set to be actual pixels,
   photoreceptors assumed to be provided in a space region surrounded by the actual pixels are set to be virtual pixels,
   the vertical transfer paths include first vertical transfer paths which are shielded and second vertical transfer paths, each having a plurality of optical openings formed in the vicinity of the virtual pixels, and
   the first and second transfer paths are provided regularly;
   a shielding member that regulates an exposure time of the solid-state image pick-up device; and a signal processor that carries out an interpolation processing based on signals obtained from the actual pixels using signals obtained from the openings as actual data of the virtual pixels.

12. The solid-state image pick-up device according to claim 11, wherein each of the opening has a size set within a packet for storing the signal charge.

13. The solid-state image pick-up device according to claim 11 or 8, wherein:
the signal processor carries out a thinning processing in the horizontal direction by using the signals obtained from the actual pixels through the first vertical transfer path in each pairs of the vertical transfer paths in two lines which serve to transfer the signal charges of the photoreceptors in a dynamic image photographing mode for reading at a predetermined interval in contrast with a static image photographing mode in which all of the actual data of the actual pixel and the virtual pixel are used, and
the first transfer paths are shielded with an array of color filter segments for separating colors.

14. The solid-state image pick-up device according to claim 11 or 8, wherein the solid-state image pick-up device carries out thinning reading in the vertical direction in the dynamic image photographing mode.

15. The solid-state image pick-up device according to claim 11 or 8, wherein the signals obtained in the openings are used as information of the virtual pixels in a static image photographing mode.

16. A solid-state image pick-up device comprising:
photoreceptors provided in a two-dimensional array and serving to convert incident light into signal charges;
a plurality of vertical transfer path that transfers the signal charges converted by the photoreceptors in a vertical direction;
a horizontal transfer path that transfers the transferred signal charges in a horizontal direction which is orthogonal to the vertical direction, wherein:
an interval between the photoreceptors provided in the vertical and horizontal directions are set to be a pitch, the photoreceptors which are adjacent to each other are provided with a shift of an almost half pitch,
the vertical transfer paths are formed to make pairs of two lines between the photoreceptors provided in the horizontal direction and are caused to make a detour every line for the photoreceptors which are adjacent to each other,
the photoreceptors that are actually provided are set to be actual pixels,
photoreceptors assumed to be provided in a space region surrounded by the actual pixels are set to be virtual pixels,
the vertical transfer paths include first vertical transfer paths which are shielded and second vertical transfer paths having optical openings formed in the vicinity of the virtual pixels,
the first and second transfer paths are provided regularly, and
the first vertical transfer paths are provided in such a manner that a positional relation among colors of filters corresponding to photoreceptors adjacent to the first vertical transfer paths is identical with a positional relation among colors of filters corresponding to photoreceptors adjacent to the vertical transfer paths.

17. The solid-state image pick-up device according to claim 16, wherein each of the opening has a size set within a packet for storing the signal charge.

18. The solid-stage image pick-up device according to claim 16 or 13, wherein signals obtained from the openings are used as information of the virtual pixels in a static image photographing mode in which all of actual signals obtained from the actual pixels and the virtual pixels are used.

19. The solid-stage image pick-up device according to claim 16 or 13, wherein thinning reading in the vertical direction is carried out in a dynamic image photographing mode for reading at a predetermined interval in contrast with the static image photographing mode.

* * * * *